US009496331B2

(12) United States Patent
Eguchi et al.

(10) Patent No.: US 9,496,331 B2
(45) Date of Patent: Nov. 15, 2016

(54) SEMICONDUCTOR DEVICE HAVING VERTICAL MOSFET WITH SUPER JUNCTION STRUCTURE, AND METHOD FOR MANUFACTURING THE SAME

(71) Applicant: DENSO CORPORATION, Kariya, Aichi-pref. (JP)

(72) Inventors: Kouji Eguchi, Kariya (JP); Youhei Oda, Okazaki (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/649,595

(22) PCT Filed: Dec. 3, 2013

(86) PCT No.: PCT/JP2013/007064
§ 371 (c)(1),
(2) Date: Jun. 4, 2015

(87) PCT Pub. No.: WO2014/087633
PCT Pub. Date: Jun. 12, 2014

(65) Prior Publication Data
US 2015/0333153 A1    Nov. 19, 2015

(30) Foreign Application Priority Data

Dec. 7, 2012   (JP) ................................ 2012-268412
Dec. 7, 2012   (JP) ................................ 2012-268413
Oct. 25, 2013  (JP) ................................ 2013-222256

(51) Int. Cl.
*H01L 21/336*    (2006.01)
*H01L 29/06*     (2006.01)
(Continued)

(52) U.S. Cl.
CPC ......... *H01L 29/06* (2013.01); *H01L 21/26513* (2013.01); *H01L 21/306* (2013.01);
(Continued)

(58) Field of Classification Search
CPC ....................... H01L 29/7813; H01L 29/7802
USPC .................................................. 438/268, 270
See application file for complete search history.

(56) References Cited

U.S. PATENT DOCUMENTS 8,039,898 B2    10/2011  Saggio et al.
2008/0160702 A1  7/2008  Nakazawa et al.
(Continued)

FOREIGN PATENT DOCUMENTS

JP    2010-118536 A    5/2010
JP    2010-161114 A    7/2010
JP    2012-064660 A    3/2012

OTHER PUBLICATIONS

International Search Report and Written Opinion of the International Searching Authority dated Feb. 10, 2014 issued in the corresponding International application No. PCT/JP2013/007064 (and English translation).

*Primary Examiner* — Jami M Valentine
(74) *Attorney, Agent, or Firm* — Posz Law Group, PLC

(57) ABSTRACT

A method for manufacturing a semiconductor device includes: preparing a semiconductor substrate, in which a first semiconductor layer is formed on a substrate; forming a first concave portion in the first semiconductor layer; forming trenches on the first semiconductor layer in the first concave portion; epitaxially growing a second semiconductor layer for embedding in each trench and the first concave portion; forming a SJ structure having PN columns including the second semiconductor layer in each trench and the first semiconductor layer between the trenches; and forming the vertical MOSFET by: forming a channel layer and a source region contacting the channel layer on the SJ structure; forming a gate electrode over the channel layer through a gate insulating film; forming a source electrode connected to the source region; and forming a drain electrode on a rear of the substrate.

16 Claims, 18 Drawing Sheets

(51) Int. Cl.
  *H01L 29/66* (2006.01)
  *H01L 21/308* (2006.01)
  *H01L 21/306* (2006.01)
  *H01L 21/265* (2006.01)
  *H01L 29/78* (2006.01)
  *H01L 29/10* (2006.01)

(52) U.S. Cl.
  CPC ....... *H01L21/308* (2013.01); *H01L 21/30625* (2013.01); *H01L 29/0615* (2013.01); *H01L 29/0634* (2013.01); *H01L 29/0692* (2013.01); *H01L 29/66* (2013.01); *H01L 29/66712* (2013.01); *H01L 29/66734* (2013.01); *H01L 29/7802* (2013.01); *H01L 29/7811* (2013.01); *H01L 29/7813* (2013.01); *H01L 29/063* (2013.01); *H01L 29/1095* (2013.01)

(56) References Cited

U.S. PATENT DOCUMENTS

| | | | |
|---|---|---|---|
| 2009/0317959 A1* | 12/2009 | Takei | H01L 23/544 438/429 |
| 2009/0321819 A1* | 12/2009 | Kagata | H01L 29/0634 257/330 |
| 2010/0059818 A1 | 3/2010 | Sasaki | |
| 2011/0241111 A1* | 10/2011 | Tamaki | H01L 29/0634 257/342 |
| 2013/0164913 A1 | 6/2013 | Eguchi et al. | |

* cited by examiner

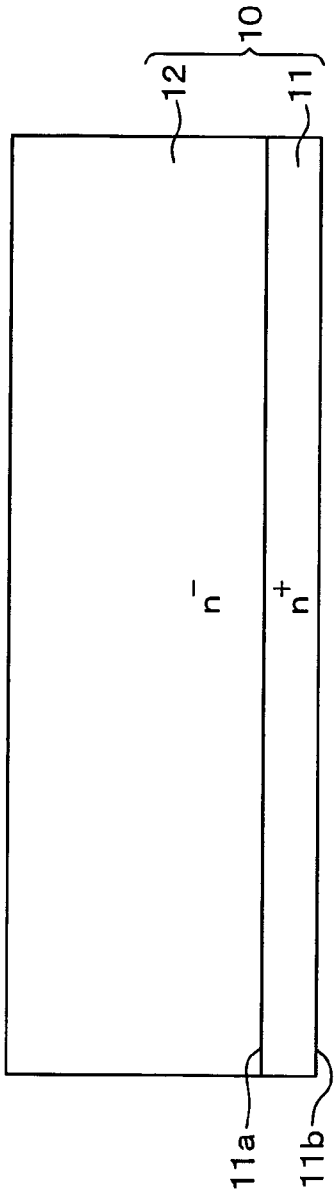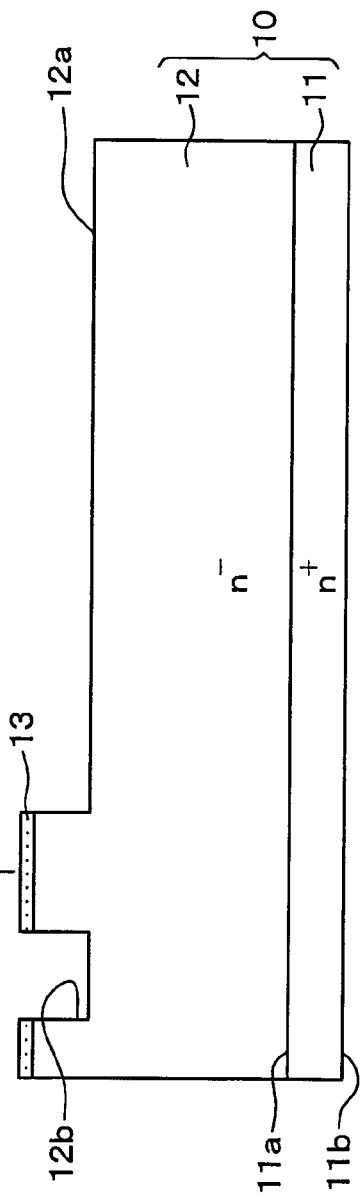

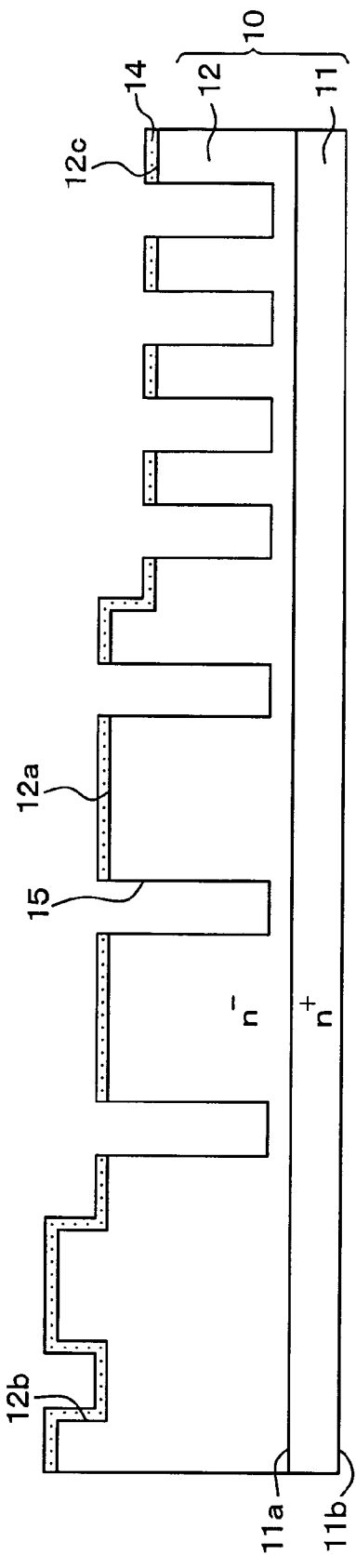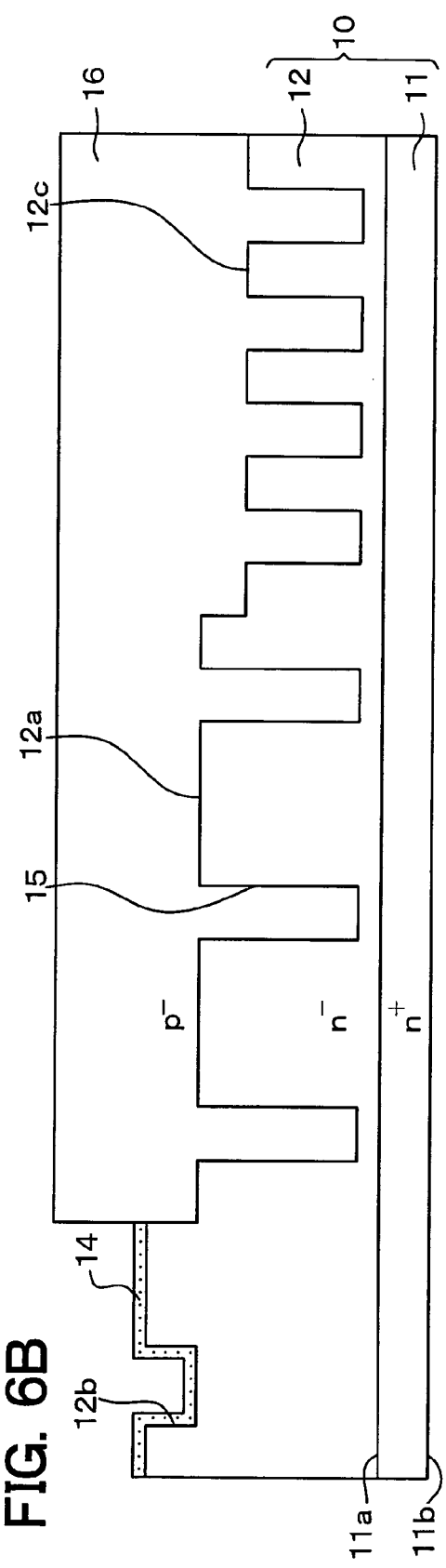

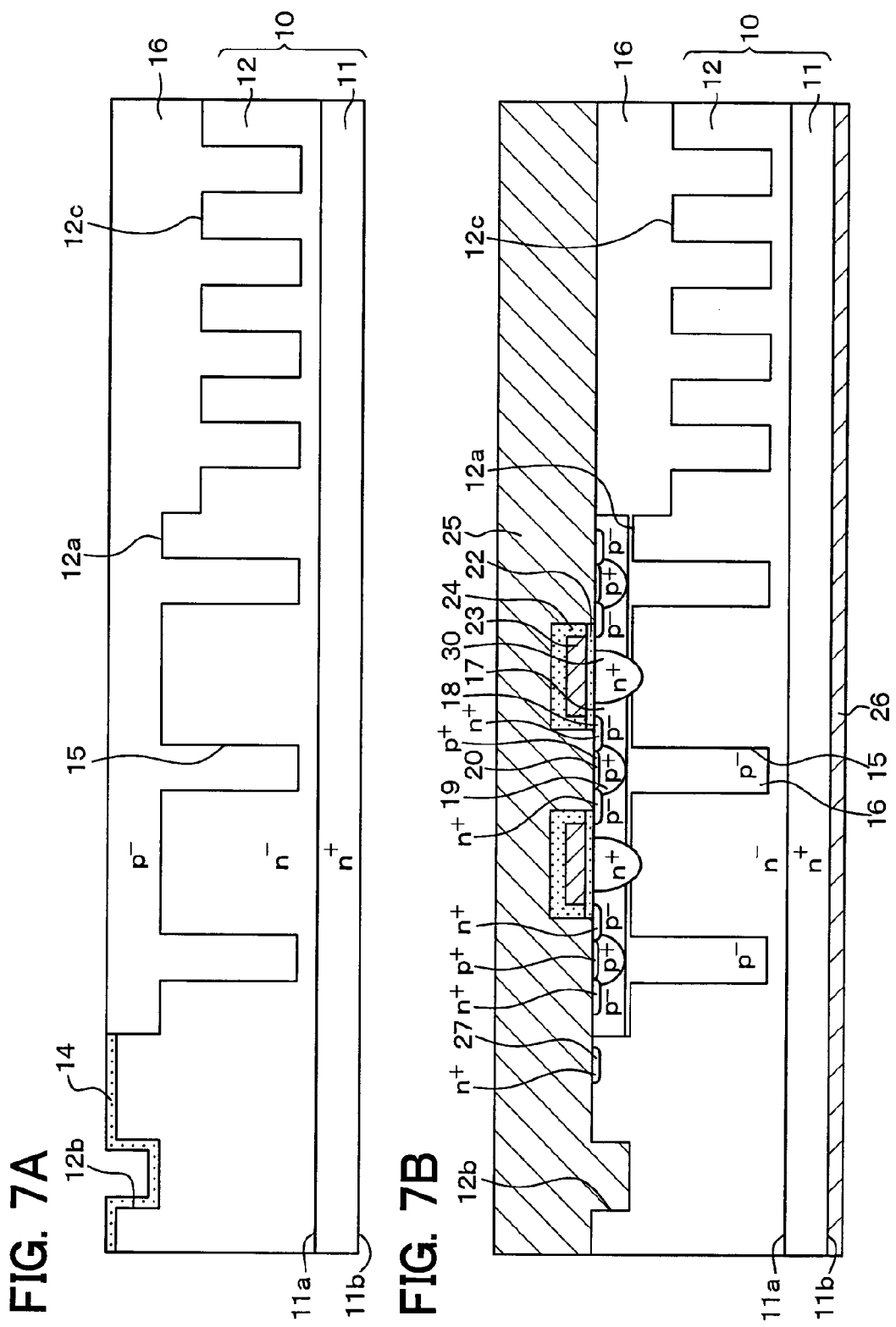

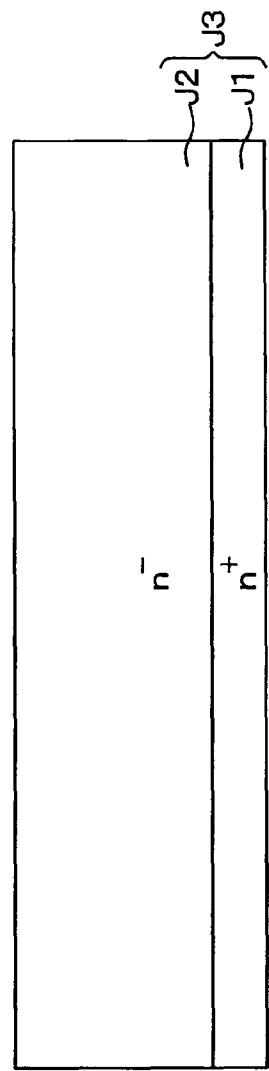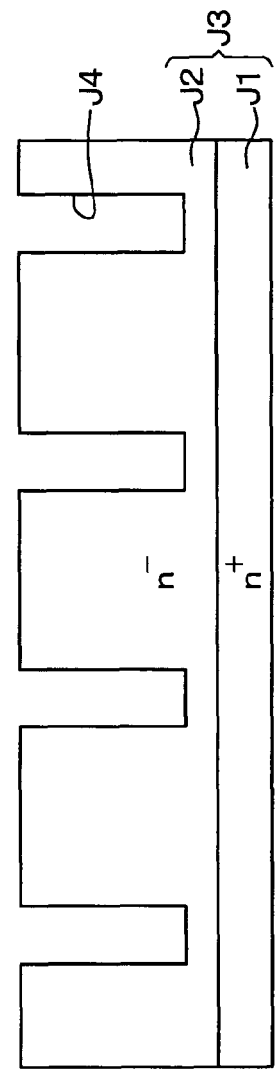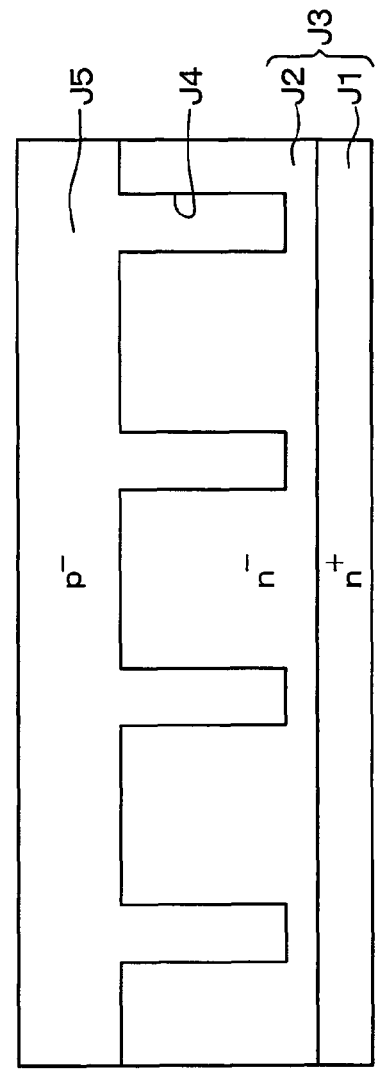
FIG. 9A PRIOR ART
FIG. 9B PRIOR ART
FIG. 9C PRIOR ART

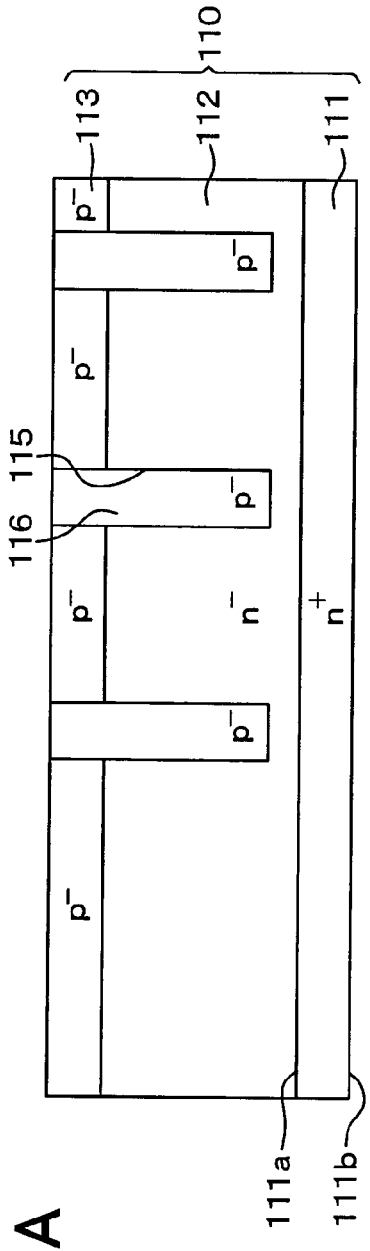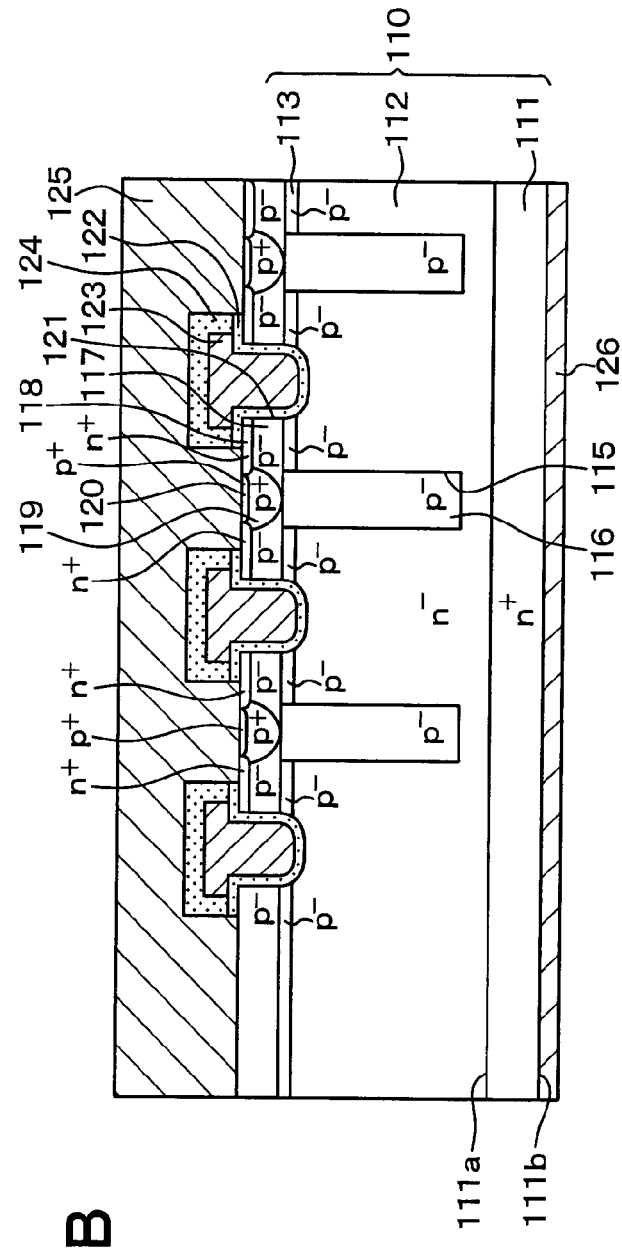

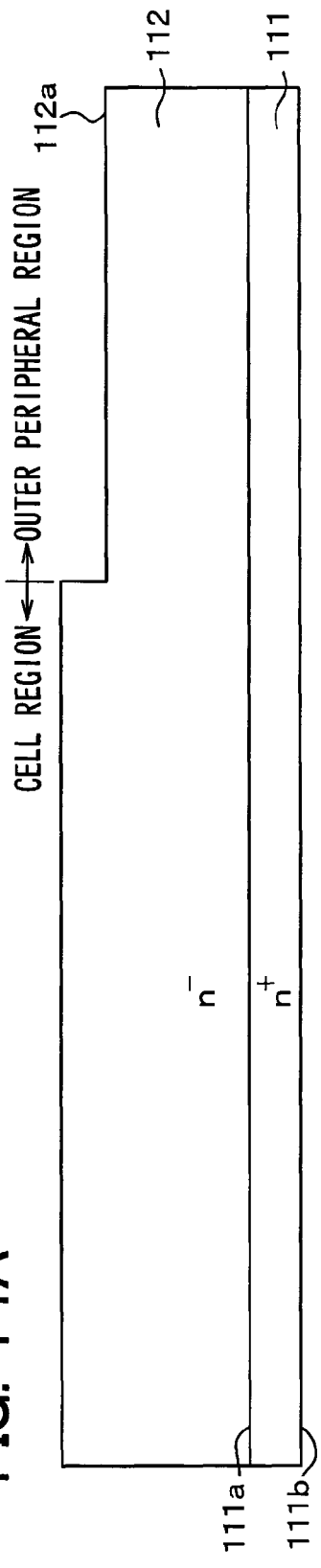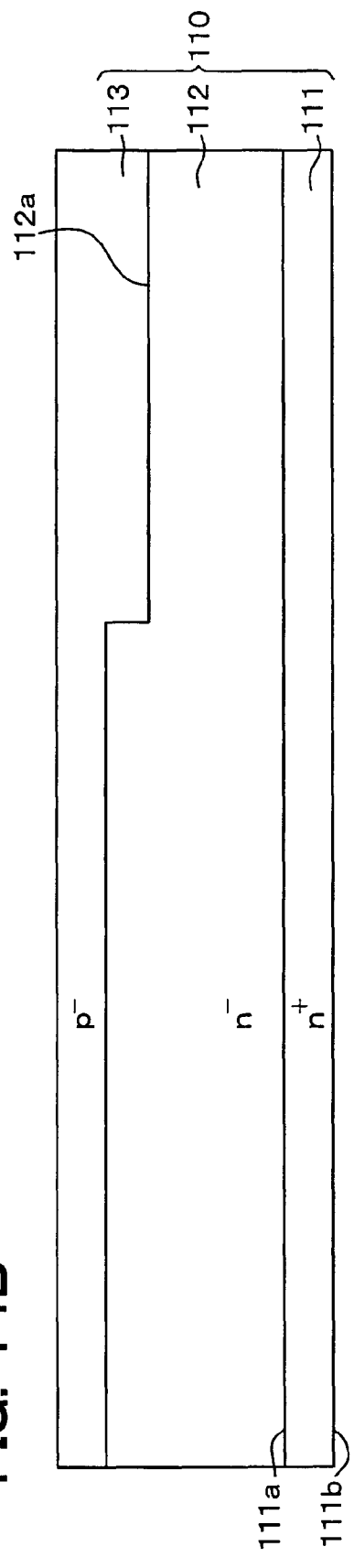

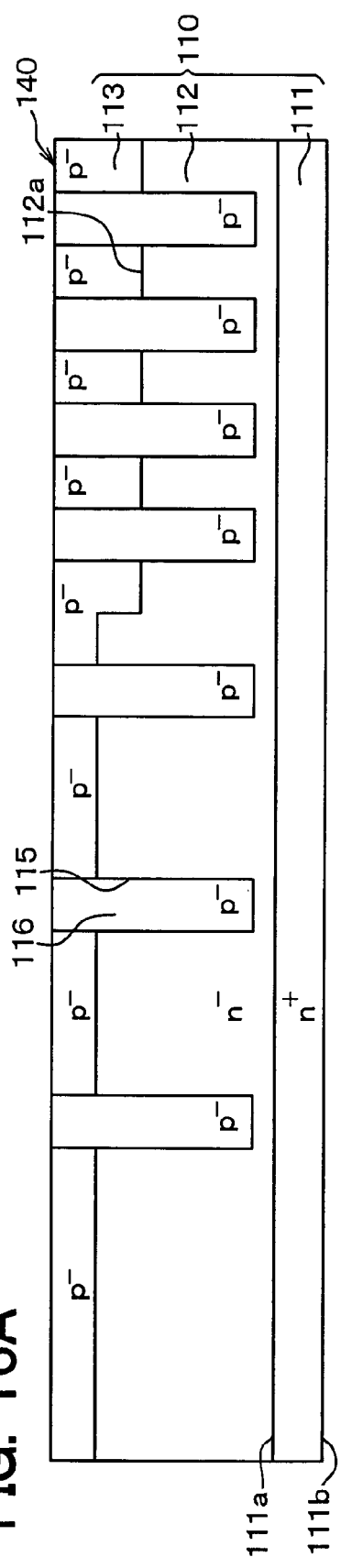
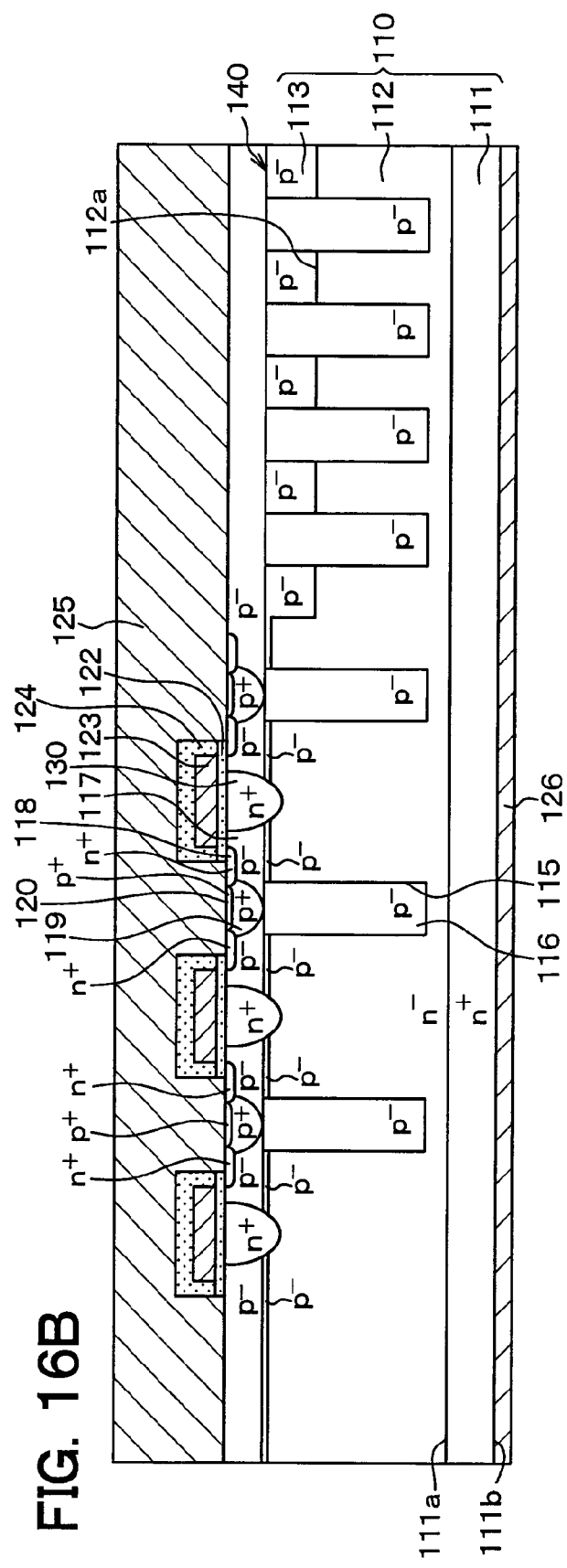

006331 B2

SEMICONDUCTOR DEVICE HAVING VERTICAL MOSFET WITH SUPER JUNCTION STRUCTURE, AND METHOD FOR MANUFACTURING THE SAME

CROSS REFERENCE TO RELATED APPLICATION

This application is a U.S. national stage of International Application No. PCT/JP2013/007064 filed on Dec. 3, 2013 and is based on Japanese Patent Applications No. 2012-268412 filed on Dec. 7, 2012, No. 2012-268413 filed on Dec. 7, 2012 and No. 2013-222256 filed on Oct. 25, 2013, the disclosures of which are incorporated herein by reference.

TECHNICAL FIELD

The present disclosure relates to a semiconductor device having a vertical MOSFET with a super junction (hereinafter referred to as "SJ") structure in which a second semiconductor layer is epitaxially grown within a trench formed in a first semiconductor layer to form the SJ structure, and a method for manufacturing the same.

BACKGROUND ART

Up to now, semiconductor devices having the SJ structure in which n-type columns and p-type columns are alternately repetitively formed have been known (for example, refer to PTL 1). In manufacturing the semiconductor device of the SJ structure, for example, as illustrated in FIG. 9A, a semiconductor substrate J3 in which an $n^-$ type layer J2 is epitaxially grown on a surface of an $n^+$ type silicon substrate J1 is used. After trenches J4 have been formed in the $n^-$ type layer J2 as illustrated in FIG. 9B, a $p^-$ type layer J5 is epitaxially grown within the trenches J4 as illustrated in FIG. 9C. Then, as illustrated in FIG. 10A, the $p^-$ type layer J5 formed outside the trenches J4 is removed by flattening and polishing the surface to leave the $p^-$ type layer J5 only within the trenches J4. As a result, the SJ structure having a PN column in which n type columns formed of the $n^-$ type layer J2 and $p^-$ type columns formed of the $p^-$ type layer J5 are alternately repeated is formed.

Thereafter, as illustrated in FIG. 10B, after the SJ structure has been formed, a $p^-$ type layer J6 is epitaxially grown, and then a subsequent device forming process is conducted. For example, as illustrated in FIG. 10C, a process of forming an $n^+$ type source region J7, a trench gate structure J8, a surface electrode J9, and a back surface electrode J10 is performed in the same technique as that in the conventional art. Through this technique, the vertical MOS transistor of the SJ structure is manufactured.

However, the flattening and polishing of surfaces of the $p^-$ type layer J5 and the $n^-$ type layer J2 is performed after the $p^-$ type layer J5 has been epitaxially grown so as to fill in the trenches J4. A variation in the flattening and polishing is large, and depths of the PN columns are varied, and cannot reach a desired depth with high precision. Aside from a problem on a precision of the epitaxial growth per se, this is further because the flattening and polishing of the $p^-$ type layer J5 and the $n^-$ type layer J2 is performed by a process for polishing the same semiconductor material (for example, silicon), and it is difficult to stop the polishing with a target film thickness in principle. When the depths of the PN columns are thus varied, a breakdown voltage of the semiconductor device is varied resulting in such a problem that the device characteristics are deteriorated.

The $p^-$ type layer J6 is epitaxially grown on the SJ structure after the SJ structure has been formed. However, there also arises such a problem that processing between structures of the surface of the SJ structure and the $p^-$ type layer J6 causes the $p^-$ type layer J6 on an upper side thereof to abnormally grow, resulting in the deterioration of the device characteristics. In the present specification, the processing between the structures means the flattening and polishing of the surface of the SJ structure after the SJ structure has been formed, and wafer cleaning before the growth of the $p^-$ type layer J6. Crystal defects may occur depending on this processing, and the crystal defects may be taken over to abnormally grow the p-type layer.

Since the process of forming the $p^-$ type layer J6 is performed, independently, there also arises such a problem that the manufacturing costs rise with an increase in the number of manufacturing processes.

PRIOR ART LITERATURES

Patent Literature

Patent Literature 1: JP-2012-064660

SUMMARY OF INVENTION

It is a first object of the present disclosure to provide a semiconductor device having a vertical MOSFET with a SJ structure, and a method for production of the semiconductor device, which are capable of suppressing the deterioration of device characteristics with the suppression of a variation in the depths of PN columns, and simplifying a manufacturing process. It is a second object of the present disclosure to provide a semiconductor device having a vertical MOSFET of an SJ structure, and a method for production of the semiconductor device, which suppress an abnormal growth of a second conductivity type layer in forming the second conductivity type layer on a first semiconductor layer after a second semiconductor layer of a second conductivity type is embedded in trenches formed in a first semiconductor layer of a first conductivity type to form an SJ structure, and suppress the deterioration of the device characteristics.

According to a first aspect of the present disclosure, a method for manufacturing a semiconductor device having a vertical MOSFET with a super junction structure includes: preparing a semiconductor substrate, in which a first semiconductor layer having a first conductivity type is formed on a surface of a substrate made of a semiconductor material; forming a step in the first semiconductor layer by forming a first concave portion that includes at least a part of a main region of the first semiconductor layer, the main region in which the vertical MOSFET is formed and used as a chip; forming a plurality of trenches by arranging a mask on the first semiconductor layer including an inside of the first concave portion, and etching the first semiconductor layer in the first concave portion of the main region using the mask; epitaxially growing a second semiconductor layer having a second conductivity type on the first semiconductor layer, and embedding the second semiconductor layer in each of the trenches and the first concave portion after removing at least a portion of the mask, which is formed in the first concave portion; forming a super junction structure having PN columns, in which a second conductivity type column provided by the second semiconductor layer left in each of the trenches and a first conductivity type column provided by the first semiconductor layer, which are arranged between the plurality of trenches, are alternately repeated, by flattening and polishing the second semiconductor layer to leave the second semiconductor layer in each of the trenches and the first concave portion; and forming the vertical MOSFET by: forming a channel layer having the first conductivity type and a source region having the second conductivity type in contact with the channel layer on the super junction structure; forming a gate electrode over a surface of the channel layer through a gate insulating film; forming a source electrode electrically connected to the source region on a surface side of the semiconductor substrate; and forming a drain electrode connected to a rear surface of the substrate on a rear surface side of the semiconductor substrate.

In the above method for manufacturing the semiconductor device, the first concave portion is formed in the first semiconductor layer in advance, and the second semiconductor layer is also embedded in the first concave portion when the second semiconductor layer is formed to be embedded in the trenches. For that reason, a portion of the second semiconductor layer which is formed in the first concave portion can be used as the second conductivity type layer formed on the SJ structure. Therefore, the second conductivity type layer for forming the second conductivity type columns and the second conductivity type layer formed on the SJ structure can be configured by the same second semiconductor layer, and can be formed at the same time. As a result, the manufacturing process can be simplified. There is no need to perform processing between the structures of the surface of the PN column and the second semiconductor layer such as the planar polishing of the surface of the PN columns or the wafer cleaning unlike a case of forming the second conductivity type layer on the SJ structure after the SJ structure has been configured. Hence, a variation in the breakdown voltage of the semiconductor device can be suppressed, and the deterioration of the device characteristic can be suppressed.

Alternatively, the method may further includes: forming a third concave portion in an outer peripheral region, which is a peripheral region of the main region where the vertical MOSFET is formed in the first semiconductor layer, before the epitaxially growing of the second semiconductor layer. In the epitaxially growing of the second semiconductor layer, the second semiconductor layer is formed on the first semiconductor layer to embed the second semiconductor layer in the third concave portion. In this case, the third concave portion is formed in the first semiconductor layer in advance, and the second semiconductor layer is also embedded in the third concave portion. With this configuration, even if the second semiconductor layer is removed on the first semiconductor layer, and polished until the first semiconductor layer is exposed in planarly polishing the second semiconductor layer, the second semiconductor layer is left in the third concave portion. For that reason, a resurf layer can be surely configured in the outer peripheral region.

According to a second aspect of the present disclosure, a method for manufacturing a semiconductor device having a vertical MOSFET with a super junction structure, includes: preparing a semiconductor substrate, in which a first semiconductor layer of a first conductivity type is formed on a surface of a substrate made of a semiconductor material; forming a plurality of trenches by etching the first semiconductor layer in a main region, in which the vertical MOSFT is formed and used as a chip, after a mask is arranged on the first semiconductor layer; forming the super junction structure having PN columns, in which a second conductivity type column provided by a second semiconductor layer left in each of the trenches and a first conductivity type column provided by the first semiconductor layer arranged between the plurality of trenches are alternately repeated, by epitaxially growing the second semiconductor layer having a second conductivity type on a part of the first semiconductor layer outside of the trenches, and embedding the second semiconductor layer in each of the trenches; and forming the vertical MOSFET by: forming a channel layer having the first conductivity type and a source region having the second conductivity type in contact with the channel layer on the super junction structure; forming a gate electrode over a surface of the channel layer through a gate insulating film; forming a source electrode electrically connected to the source region on a surface side of the semiconductor substrate; and forming a drain electrode connected to a rear surface of the semiconductor substrate on the rear surface side of the semiconductor substrate.

In the above method for manufacturing the semiconductor device, after the second semiconductor layer has been formed in the trenches formed in the first semiconductor layer, the second semiconductor layer is also continuously formed on a portion of the first semiconductor layer outside the trenches. In other words, the second semiconductor layer is further formed on the portion of the first semiconductor layer outside the trenches without performing the processing between the structures of the first semiconductor layer and the second semiconductor layer such as planar polishing after embedding the second semiconductor layer in the trenches. For that reason, in forming the second conductivity type layer on the first semiconductor layer, the abnormal growth of the second conductivity type layer can be suppressed, and the deterioration of the device characteristics can be suppressed.

According to a third aspect of the present disclosure, a semiconductor device having a vertical MOSFET with a super junction structure, includes: a semiconductor substrate, in which a first semiconductor layer having a first conductivity type is arranged on a surface of a substrate made of a semiconductor material; a first concave portion that is arranged in a part of the first semiconductor layer; a convex portion that is provided by a step arranged in the first semiconductor layer with the first concave portion, and is located in the first semiconductor layer outside the first concave portion; a plurality of trenches that is arranged in the first semiconductor layer on a lower side of the first concave portion; a second semiconductor layer having a second conductivity type that is embedded in each of the trenches and the first concave portion, and epitaxially arranged on the first semiconductor layer; the super junction structure having PN columns, in which a second conductivity type column provided by the second semiconductor in each of the trenches, and a first conductivity type column provided by the first semiconductor layer arranged between the plurality of trenches are alternately repeated; a channel layer having a first conductivity type and a source region having a second conductivity type in contact with the channel layer, which are arranged on the super junction structure; a gate electrode that is arranged over a surface of the channel layer through a gate insulating film; a source electrode that is electrically connected to the source region; and a drain electrode that is connected to a rear surface of the substrate arranged on a rear surface side of the semiconductor substrate.

In the above semiconductor device, the first concave portion is formed in the first semiconductor layer in advance, and the second semiconductor layer is also embedded in the first concave portion when the second semiconductor layer is arranged to be embedded in the trenches. For that reason, a portion of the second semiconductor layer which is formed in the first concave portion can be used as the second conductivity type layer formed on the SJ structure. Therefore, the second conductivity type layer for forming the second conductivity type columns and the second conductivity type layer formed on the SJ structure can be configured by the same second semiconductor layer, and can be formed at the same time. As a result, the manufacturing process can be simplified. There is no need to perform processing between the structures of the surface of the PN column and the second semiconductor layer such as the planar polishing of the surface of the PN columns or the wafer cleaning unlike a case of forming the second conductivity type layer on the SJ structure after the SJ structure has been configured. Hence, a variation in the breakdown voltage of the semiconductor device can be suppressed, and the deterioration of the device characteristic can be suppressed.

According to a fourth aspect of the present disclosure, a method for manufacturing a semiconductor device having a vertical MOSFET with a super junction structure, includes: preparing a semiconductor substrate, in which a first semiconductor substrate having a first conductivity type is formed on a surface of a substrate made of a semiconductor material, and a second semiconductor layer having a second conductivity type is formed on the first semiconductor layer; forming a plurality of trenches that penetrates the second semiconductor layer, and reaches the first semiconductor layer by arranging a mask on the second semiconductor layer, and etching the second semiconductor layer and the first semiconductor layer using the mask; epitaxially growing a third semiconductor layer having a second conductivity type on the second semiconductor layer, and embedding the third semiconductor layer in each of the trenches after removing at least a portion of the mask which is located in a periphery of each of the trenches; forming the super junction structure having PN columns, in which a second conductivity column provided by the third semiconductor layer left in each of the trenches and a first conductivity type column provided by the first semiconductor layer between the plurality of trenches are alternately repeated, by flattening and polishing the third semiconductor layer to expose the second semiconductor layer and to leave the third semiconductor layer in each of the trenches; and forming the vertical MOSFET by: forming a channel layer having the first conductivity type and a source region having the second conductivity type in contact with the channel layer on the super junction structure; forming a gate electrode over a surface of the channel layer through a gate insulating film; forming a source electrode electrically connected to the source region on a surface side of the semiconductor substrate; and forming a drain electrode connected to a rear surface of the substrate on a rear surface side of the semiconductor substrate.

In the above method for producing the semiconductor device, the second semiconductor layer is formed on the first semiconductor layer in advance before the trenches for forming the second conductivity type columns are formed, and the trenches are formed in the surface of the second semiconductor layer. Then, the third semiconductor layer for forming the second conductivity type columns is formed in the trenches and on the second semiconductor layer. For that reason, unlike a case in which the third semiconductor layer is formed after the SJ structure has been configured, the surface of the PN columns are not planarly polished, and there is no need to perform the processing between the structures of the surface of the PN columns and the third semiconductor layer. Therefore, the depth of the PN columns is not affected by planarly polishing the third semiconductor layer. Hence, a variation in the breakdown voltage of the semiconductor device can be suppressed, and the deterioration of the device characteristic can be suppressed.

Alternatively, the preparing of the semiconductor substrate may be performed by: preparing the semiconductor substrate, in which a concave portion is formed in an outer peripheral region of the first semiconductor layer as a peripheral region of a cell region in which the vertical MOSFET is formed, and the second semiconductor layer is formed on the first semiconductor layer to embed the second semiconductor layer in the concave portion. In this case, the concave portion is formed in the first semiconductor layer in advance, and the second semiconductor layer is also embedded in the concave portion. For that reason, even if the second semiconductor layer is removed, and polished until the first semiconductor layer is exposed in planarly polishing the third semiconductor layer, the second semiconductor layer is left in the concave portion. For that reason, a resurf layer can be surely configured in the outer peripheral region.

BRIEF DESCRIPTION OF DRAWINGS

The above and other objects, features and advantages of the present disclosure will become more apparent from the following detailed description made with reference to the accompanying drawings. In the drawings:

FIGS. 1A and 1B are cross-sectional views illustrating a process for producing a semiconductor device having a trench gate vertical MOSFFET of an SJ structure according to a first embodiment of the present disclosure;

FIGS. 6A and 6B are cross-sectional views illustrating a process for producing the semiconductor device having the planar vertical MOSFFET of the SJ structure subsequent to FIG. 5B;

FIGS. 7A and 7B are cross-sectional views illustrating a process for producing the semiconductor device having the planar vertical MOSFFET of the SJ structure subsequent to FIG. 6B;

FIGS. 9A to 9C are cross-sectional views illustrating a process for producing a semiconductor device having a vertical MOSFFET of a trench gate structure of an SJ structure in the conventional art;

FIGS. 12A and 12B are cross-sectional views illustrating a process for producing the semiconductor device having the trench gate vertical MOSFFET of the SJ structure subsequent to FIG. 11C;

FIGS. 14A and 14B are cross-sectional views illustrating a process for producing a semiconductor device having a planar vertical MOSFFET of an SJ structure according to a third embodiment of the present disclosure;

FIGS. 16A and 16B are cross-sectional views illustrating a process for producing the semiconductor device having the planar vertical MOSFFET of the SJ structure subsequent to FIG. 15B;

EMBODIMENTS FOR CARRYING OUT INVENTION

Figure 2A:
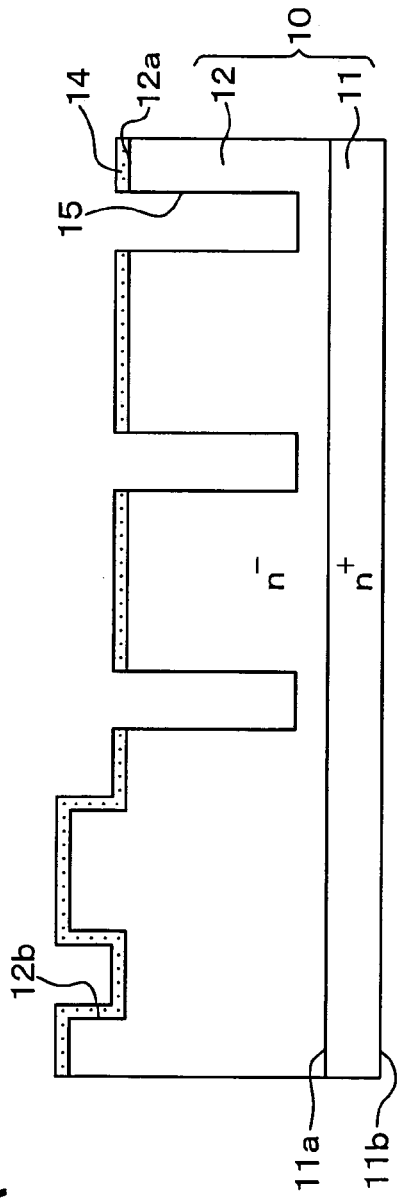
FIGS. 2A and 2B are cross-sectional views illustrating a process for producing the semiconductor device having the trench gate vertical MOSFFET of the SJ structure subsequent to FIG. 1B.

Embodiments of the present disclosure will be described below with reference to the drawings. In the following respective embodiments, parts identical with or equivalent to each other are denoted by the same symbols for description.

First Embodiment

Subsequently, a method for producing a semiconductor device according to a first embodiment of the present disclosure will be described with reference to FIGS. 1A to 2B. A vertical MOSFET of an SJ structure will be exemplified by a semiconductor device having a trench gate vertical MOSFET.

[Process Illustrated in FIG. 1A]

A semiconductor substrate 10 is prepared. In the semiconductor substrate 10, an n⁻ type layer 12 corresponding to a first semiconductor layer is epitaxially grown on a surface 11a of an n⁺ type silicon substrate 11 as a substrate made of a semiconductor material with the surface 11a and the rear surface 11b. The n⁺ type silicon substrate 11 is a portion that functions as a drain region, and set to be higher in an n-type impurity concentration than the n⁻ type layer 12. The n⁻ type layer 12 is a portion that functions as a drift layer and also configures an n-type column in PN columns.

[Process Illustrated in FIG. 1B]

On a surface side of the semiconductor substrate 10, an oxide film 13 is formed on a surface of the n⁻ type layer 12 through a CVD (chemical vapor deposition) technique or thermal oxidation. Thereafter, a resist not shown is arranged on the oxide film 13, the resist is opened in a main region in which a vertical MOSFET is formed and used as a chip, and the resist is also opened in a scribe region, through a photolithography process. In this situation, the resist is left at a boundary position between the main region and the scribe region. Then, an etching process is executed to open the oxide film 13 at an open position of the resist.

Then, the resist is removed, and anisotropic etching such as an RIE (reactive ion etching) technique or a BOSCH technique is performed with the oxide film 13 as a mask. In the BOSCH technique, $O_2$ and $C_4F_8$ as well as $SF_6$ are alternately repetitively introduced to repetitively perform bottom etching and side wall protection using a polymer film. Specifically, etching is performed to the degree of removing the n⁻ type layer 12 by a predetermined depth of about 2.5 to 3.5 μm. With this process, a concave portion 12a is formed in the main region of the n⁻ type layer 12 to provide a step between the main region and the scribe region. Simultaneously, a concave portion 12b serving as a target of alignment at the time of matching the mask in a post-process is formed in the scribe region. The n⁻ type layer 12 is left in a concave shape at the boundary position between the main region and the scribe region, specifically, in at least a part of an outer edge of the main region. Thereafter, the oxide film 13 is removed.

[Process Illustrated in FIG. 2A]

Again, on the surface side of the semiconductor substrate 10, an oxide film 14 is formed in thickness of 0.2 to 0.3 μm so as to cover the n⁻ type layer 12 through the CVD technique or the thermal oxidation. Thereafter, a resist not shown is arranged on the oxide film 14, and the resist is opened at positions where trenches are to be formed, and the oxide film 14 is opened at the open positions, through a photolithography process. Then, the resist is removed, and anisotropic etching such as the RIE or the BOSCH technique is performed with the oxide film 14 as a mask. Specifically, the n⁻ type layer 12 is etched in the concave portion 12a by a predetermined depth, for example, a depth equal to or slightly smaller than a thickness of the n⁻ type layer 12. With this process, SJ structure formation trenches 15 which are, for example, stripped are formed at desired positions of the n⁻ type layer 12.

Figure 2B:
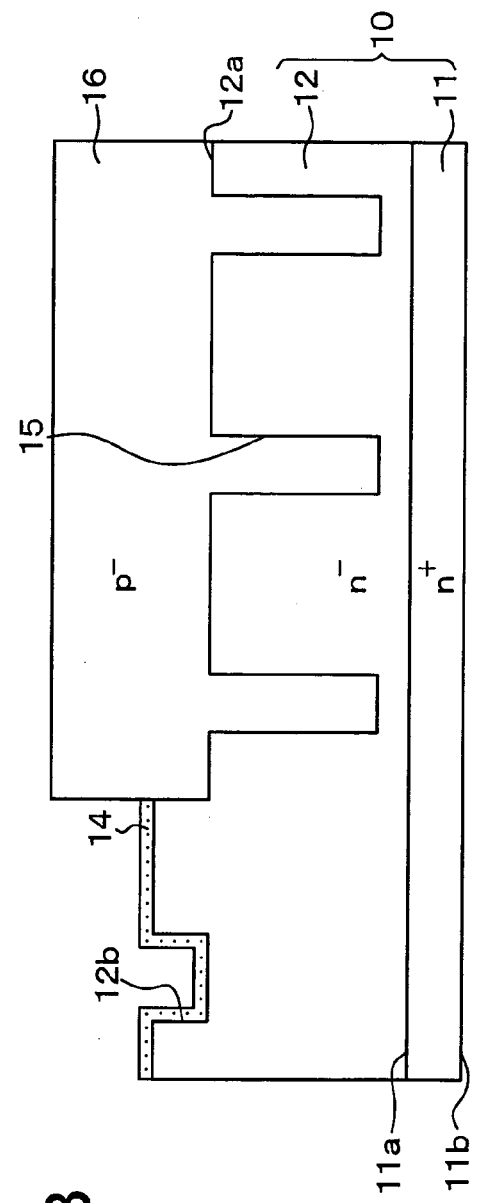

[Process Illustrated in FIG. 2B]

A portion of the oxide film 14 which is formed at a position distant from the trenches 15 is left, and portions of the oxide film 14 arranged in the periphery of the opening portions of the trenches 15, specifically, portions formed in the concave portion 12a are removed.

For example, after a resist is again arranged on the oxide film 14, the resist is opened in the main region of the semiconductor substrate 10 where the vertical MOSFET is formed and used as a chip. Then, etching is performed in a state where the scribe region to be cut at the time of dicing which is a region for forming a target of alignment is covered with a resist to pattern the oxide film 14. Alternatively, hydrogen annealing is executed to retract the portions of the oxide film 14 which are formed around the opening portions of the trenches 15 of the oxide film 14. For example, in a reduced pressure atmosphere of 10.6 kPa (80 Torr) or lower, with the execution of hydrogen annealing at a temperature of 1100° C. for a time of 10 minutes, or hydrogen annealing at a temperature of 1170° C. for a time of 2 minutes, the periphery of the opening portions of the trenches 15 in the oxide film 14 can be removed.

Thereafter, on the surface side of the semiconductor substrate 10, a p⁻ type layer 16 corresponding to a second semiconductor layer is epitaxially grown on a surface of the n⁻ type layer 12 including the insides of the concave portion 12a and the trenches 15 so that, for example, a p-type impurity concentration becomes $2 \times 10^{15}$ to $5 \times 10^{15}$ cm⁻³. In this situation, over-epitaxial growth is performed, and in the over-epitaxial growth, the p⁻ type layer 16 is also formed on the n⁻ type layer 12 while being completely embedded in the concave portion 12a and the respective trenches 15. For example, the p⁻ type layer 16 is formed on the n⁻ type layer 12 with a thickness of about 5 to 7 μm.

Figure 3A:
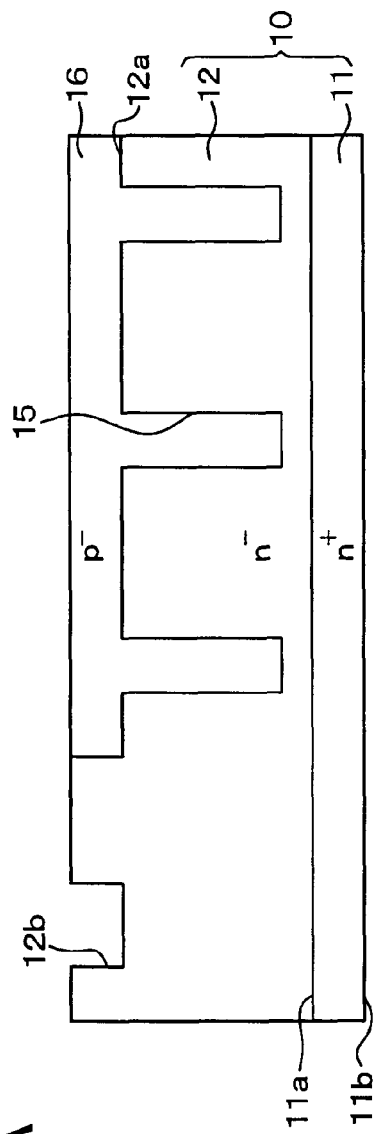
FIGS. 3A and 3B are cross-sectional views illustrating a process for producing the semiconductor device having the trench gate vertical MOSFFET of the SJ structure subsequent to FIG. 2B.

[Process Illustrated in FIG. 3A]

First, a portion of the p⁻ type layer 16 which protrudes from the semiconductor substrate 10 more than the oxide film 14, that is, a portion protruding from a convex portion other than the concave portion 12a formed in the n⁻ type layer 12 is removed by flattening and polishing of the surface such as CMP (chemical mechanical polishing). In this situation, because the oxide film 14 different from the p⁻ type layer 16 to be polished can be used as an end point detection stopper, the flattening and polishing can stop with high precision.

Subsequently, the oxide film 14 is etched. With this process, the oxide film 14 is removed in the scribe region and in the vicinity of the scribe region in the main region to form a step between the exposed n⁻ type layer 12 and the p⁻ type layer 16. For that reason, the surface is again flattened and polished through the CMP to flatten and polish the n⁻ type layer 12 and the p⁻ type layer 16 so as to eliminate the step. With this process, a structure in which the p-type columns in the SJ structure are configured by portions of the p⁻ type layer 16 which are formed in the trenches 15 while the p⁻ type layer 16 is also formed on the SJ structure is completed.

Because a polishing process of the same semiconductor material (silicon) such as the n⁻ type layer 12 and the p⁻ type layer 16 is performed in planarizing the surface, there is nothing functioning as a stopper of the surface planarization. However, because the thickness of the oxide film 14 is as very thin as 0.2 to 0.3 μm, the flattening and polishing is performed without any large variation by only time control even if there is no stopper. Since the processing between the structures of the surface of the PN columns and the p⁻ type layer 16 is not conducted, even if a slight variation occurs, a breakdown voltage of the semiconductor device is not largely varied.

Figure 3B:
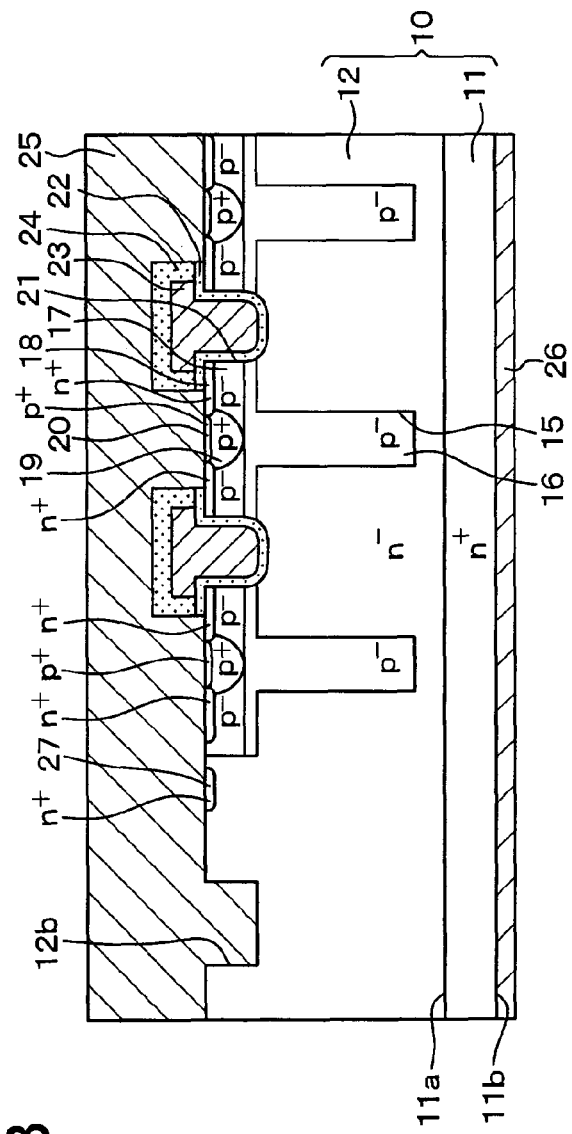

[Process Illustrated in FIG. 3B]

The subsequent processes are identical with those in the conventional art. For example, the following manufacturing process is performed. That is, p-type impurities are ion-implanted into a surface layer part of the p⁻ type layer 16 on the n⁻ type layer 12 configuring the n-type columns to form a p⁻ type channel layer 17. Also, n-type impurities are ion-implanted into a surface layer part of the p⁻ type channel layer 17 to form an n⁺ type source region 18. In this situation, the n-type impurities are also ion-implanted into a portion left in a convex shape in an outer edge of the main region as occasion demands to form an n⁺ type layer 27. This makes it possible to perform conduction with the n⁻ type layer 12, and the n⁻ type layer 12 can be fixed to a predetermined potential through the n⁺ type layer 27.

The convex portion is left in the outer edge of the main region, and the n⁺ type layer 27 is formed to enable the potential to be fixed as described above, thereby being capable of ensuring a desired breakdown voltage in the outer peripheral region. That is, in the case of a structure having no convex portion, a potential on the surface side of the n⁻ type layer 12 cannot be fixed, and the desired breakdown voltage cannot be ensured.

The p-type impurities are ion-implanted mainly into a portion of the p⁻ type channel layer 17 which is formed on each of the p-type columns to form a p⁺ type body layer 19, and also form a p⁺ type contact region 20 in a surface layer part of the p⁺ type body layer 19. Each gate trench 21 that penetrates through the p⁻ type channel layer 17 and reaches a portion of the n⁻ type layer 12 which configures each n-type column is formed. Further, a gate insulating film 22 is formed to cover an inner wall surface of each gate trench 21, and a gate electrode 23 is formed on the gate insulating film 22 so as to be embedded in each gate trench 21. A process of forming interlayer insulating films 24, and a process of forming gate lines and a source electrode 25 are performed on the surface side of the semiconductor substrate 10. On the rear surface side of the semiconductor substrate 10, a process of forming a drain electrode 26 connected to the rear surface 11b of the n⁺ type silicon substrate 11 is performed to form a trench gate vertical MOSFET of an n-channel. Thereafter, the vertical MOSFET is diced into chip units to complete semiconductor devices having the vertical MOSFET of the SJ structure.

In the above method for producing the semiconductor device according to this embodiment as described above, the concave portion 12a is formed in the n⁻ type layer 12 in advance, and the p⁻ type layer 16 is also embedded in the concave portion 12a when the p⁻ type layer 16 is formed to be embedded in the trenches 15. For that reason, a portion of the p⁻ type layer 16 which is formed in the concave portion 12a can be used as the p-type layer formed on the SJ structure.

Therefore, the p-type layer for forming the p-type columns and the p-type layer formed on the SJ structure can be configured by the same p⁻ type layer 16, and can be formed at the same time. As a result, the manufacturing process can be simplified. Unlike a case of forming the p-type layer on the SJ structure after the SJ structure has been configured, the flattening and polishing of the surface of the PN columns is not performed, and there is no need to perform processing between the structures of the surface of the PN columns and the p⁻ type layer 16 such as the flattening and polishing or the wafer cleaning. Hence, a variation in the breakdown voltage of the semiconductor device can be suppressed, and the deterioration of the device characteristic can be suppressed.

Further, a process of forming the concave portion 12a is performed simultaneously with the formation of the concave portion 12b serving as a target of alignment formed in the scribe region. For that reason, the process of forming the concave portion 12a and the process of forming the concave portion 12b can be commonalized, and the manufacturing process can be simplified.

Second Embodiment

A second embodiment of the present disclosure will be described. In this embodiment, the vertical MOSFET formed in the semiconductor device in the first embodiment is changed to a planar type, and because the other configurations are identical with those in the first embodiment, only portions different from those in the first embodiment will be described.

Subsequently, a method for producing the vertical MOSFET according to this embodiment will be described with reference to FIGS. 4A and 4B.

Figure 4A:
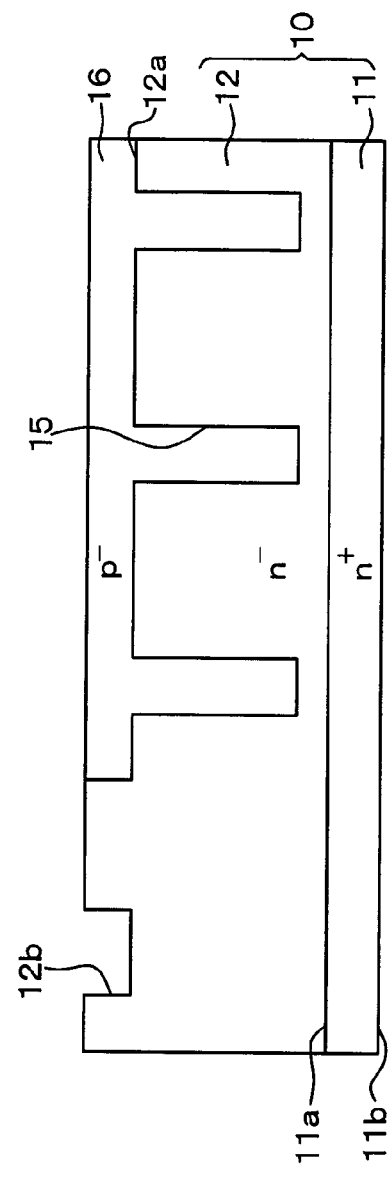
FIGS. 4A and 4B are cross-sectional views illustrating a process for producing a semiconductor device having a planar vertical MOSFFET of an SJ structure according to a second embodiment of the present disclosure.

First, after the processes in FIGS. 1A, 1B, 2A, and 2B described in the first embodiment is performed, the same process as that in FIG. 3A described in the first embodiment is performed as a process of FIG. 4A. With this process, a structure in which a p⁻ type layer 16 is epitaxially grown on the surface of an n⁻ type layer 12 including the insides of a concave portion 12a and trenches 15, and the p⁻ type layer 16 is further left in the concave portion 12a is configured on the surface side of a semiconductor substrate 10. That is, a structure in which the p⁻ type layer 16 has already been formed on the p-type columns configuring the SJ structure and the SJ structure is formed. Basically, those processes may be completely identical with those in the first embodiment. The thickness of the p⁻ type layer 16 left on the SJ structure is set to the extent that an n-type connection layer 30 to be described later can be formed through the p⁻ type layer 16 on the SJ structure in forming the n-type connection layer 30 by ion implantation.

Figure 4B:
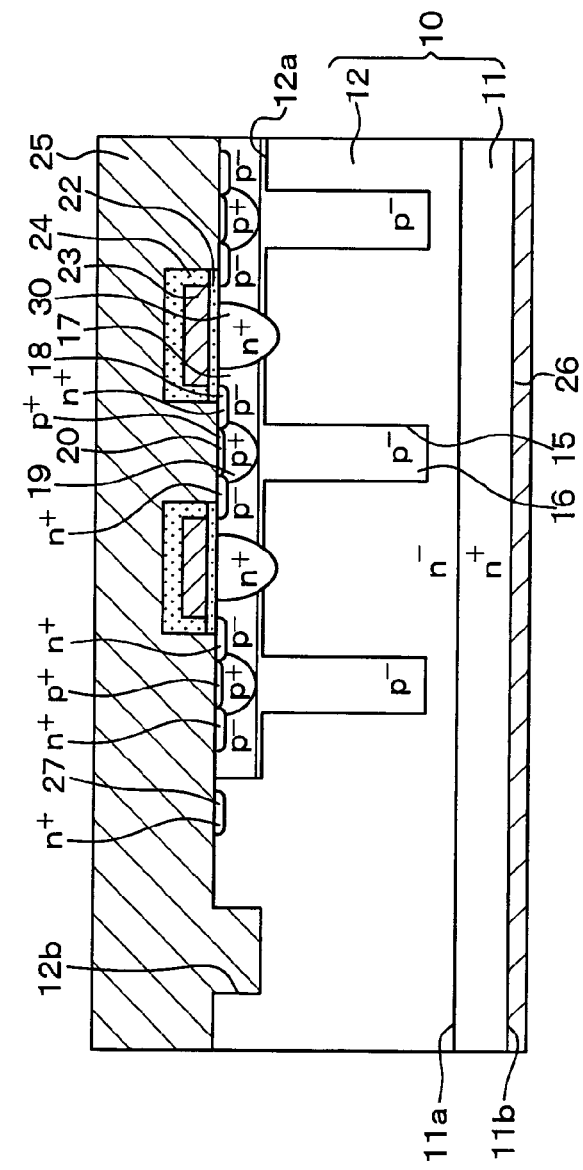

In a process illustrated in FIG. 4B, a manufacturing process for forming the respective components of the planar vertical MOSFET is performed.

That is, p-type impurities are ion-implanted into a surface layer part of the p⁻ type layer 16 on the SJ structure to form a p⁻ type channel layer 17, and n-type impurities are ion-implanted into a surface layer part of the p⁻ type channel layer 17 to form an n⁺ type source region 18. The p-type impurities are ion-implanted mainly into a portion of the p⁻ type channel layer 17 which is formed on each of the p⁻ type layer 16 to form a p⁺ type body layer 19, and also form a p⁺ type contact region 20 in a surface layer part of the p⁺ type body layer 19. Further, the n-type impurities are ion-implanted at a position spaced from each n⁺ type source region 18 by a predetermine interval between the adjacent n⁺ type source regions 18 which are arranged between the respective p⁺ type contact region 20, to thereby form the n-type connection layer 30 that reaches the n⁻ type layer 12 from the p⁻ type channel layer 17. The n-type connection layer 30 is formed to penetrate through the p⁻ type layer 16 and reach a portion of the n⁻ type layer 12 which configures each of the n-type columns while coming in contact with a channel formation part in the p⁻ type channel layer 17. With this configuration, the n-type connection layer 30 forms a current path when the planar vertical MOSFET operates, and serves to reduce an on-resistance.

Further, a gate insulating film 22 that covers at least a surface of the p⁻ type channel layer 17 is formed, and a gate electrode 23 is formed on the gate insulating film 22. A process of forming interlayer insulating films 24, and a process of forming gate lines and a source electrode 25 are performed on the surface side of the semiconductor substrate 10. On the rear surface side of the semiconductor substrate 10, a process of forming a drain electrode 26 connected to the rear surface 11b of the n⁺ type silicon substrate 11 is performed to form the planar vertical MOSFET of an n-channel. Thereafter, the vertical MOSFET is diced into chip units to complete semiconductor devices having the planar vertical MOSFET of the SJ structure.

As described above, the same manufacturing method as that in the first embodiment can be also applied to the semiconductor device having the planar vertical MOSFET, and the same advantages as those in the first embodiment can be obtained.

Third Embodiment

A third embodiment of the present disclosure will be described. This embodiment is directed to a manufacturing method taking a periphery breakdown voltage structure of the semiconductor device into account, in the second embodiment, and because the other configurations are identical with those in the second embodiment, only portions different from those in the second embodiment will be described.

A method of manufacturing a vertical MOSFET according to this embodiment, that is, a manufacturing method including a process of forming the periphery breakdown structure in the semiconductor device having the planar vertical MOSFET with the SJ structure will be described with reference to FIGS. 5A to 7B.

Figure 5A:
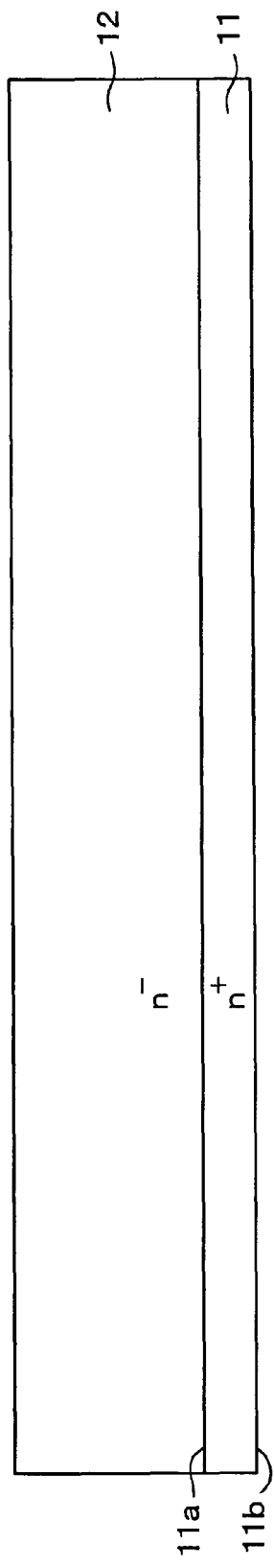
FIGS. 5A and 5B are cross-sectional views illustrating a process for producing a semiconductor device having a planar vertical MOSFFET of an SJ structure according to a third embodiment of the present disclosure.

First, in a process illustrated in FIG. 5A, a substrate made of a semiconductor material with a surface 11a and a rear surface 11b is prepared. As the substrate, the n⁻ type layer 12 corresponding to the first semiconductor layer is epitaxially grown on the surface 11a of the n⁺ type silicon substrate 11. Then, the process illustrated in FIG. 1B described in the first embodiment is performed to form the concave portions 12a and 12b. Subsequently, a concave portion 12c is formed in a portion corresponding to an outer peripheral region of the n⁻ type layer 12 through a photo-etching process using a mask not shown. Specifically, a region in which the vertical MOSFET is formed in the main region is set as a cell region, and a resurf layer is formed in the outer peripheral region to form the periphery breakdown voltage structure. The concave portion 12c is formed in the portion forming the resurf layer.

Figure 5B:
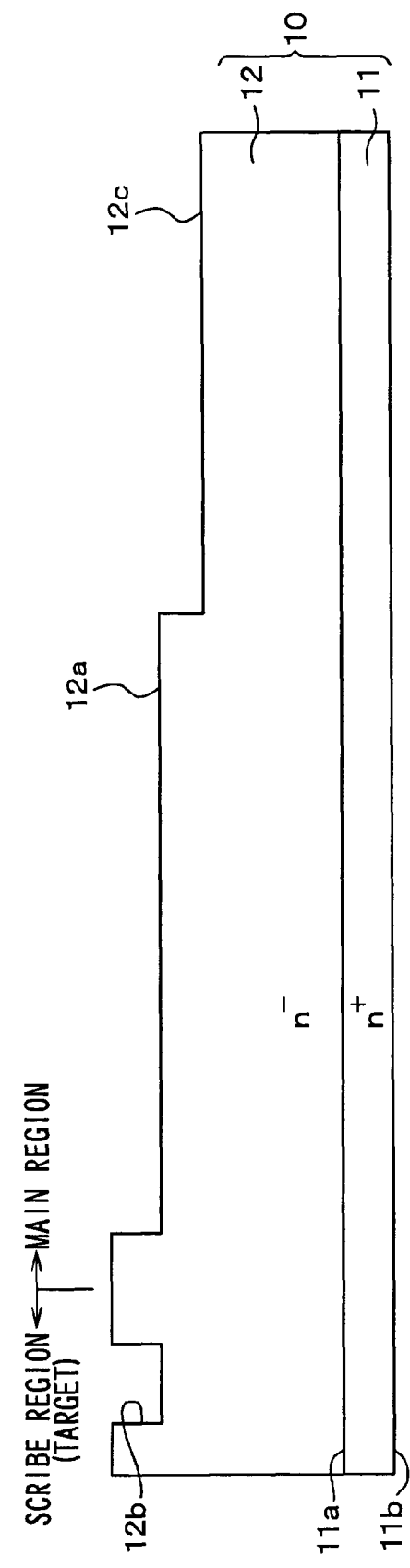

Thereafter, in a process illustrated in FIG. 5B, a p⁻ type layer 16 is epitaxially grown on the surface of the n⁻ type layer 12 so as to be embedded in the concave portion 12c, and the surface is flattened and polished as occasion demands. In this situation, the p⁻ type layer 16 is left in thickness of 3 to 7 µm, for example, on the surface of the n⁻ type layer 12. With this process, the semiconductor substrate 10 in which the p⁻ type layer 16 in the concave portion 12c is thicker than a portion in which the concave portion 12c is not formed is formed.

Thereafter, in processes illustrated in FIGS. 6A, 6B, 7A, and 7B, the same processes as those in FIGS. 2A, 2B, 4A, and 4B described in the first and second embodiments are performed. With those processes, the semiconductor device having the planar vertical MOSFET of the SJ structure is completed. In the semiconductor device, the p⁻ type layer 16 is deeply formed in the outer peripheral region of the cell region to configure a resurf layer 40 as the periphery breakdown voltage structure.

As described above, the manufacturing method taking a case in which the resurf layer is formed as the periphery breakdown voltage structure into account can be taken. Even with this method, the same advantages as those in the second embodiment can be obtained.

Even in the second embodiment, because the p⁻ type layer 16 is also formed in the outer peripheral region, even if the concave portion 12c is not formed, the resurf layer 40 can be formed in the outer peripheral region through the manufacturing method described in the second embodiment. However, as illustrated in FIG. 7A, the p⁻ type layer 16 may be removed to the degree that the n⁻ type layer 12 is exposed when the surface of the p⁻ type layer 16 is flattened and polished. Similarly, in that case, with the execution of the same process as that in FIG. 7B, the semiconductor device having the planar vertical MOSFET of the SJ structure can be manufactured. In that case, the p⁻ type layer 16 is not left in the outer peripheral region, and the resurf layer 40 cannot be formed. Therefore, as in this embodiment, the concave portion 12c is formed in the n⁻ type layer 12 in advance, and the p⁻ type layer 16 is formed to be thicker than the cell region in the outer peripheral region in advance. As a result, the resurf layer 40 can be surely formed.

When the flattening and polishing is performed to the extent that the surface of the n⁻ type layer 12 is exposed, since the n⁻ type layer 12 may be polished, there is a possibility that the depths of the PN columns are varied. However, because the on-resistance is reduced by the n-type connection layer 30, the flattening and polishing may be performed under a condition where the p⁻ type layer 16 remains, and it is not essential to expose the n⁻ type layer 12 as in the conventional art. For that reason, even if the n⁻ type layer 12 is polished, the polishing amount is very small, a variation in the breakdown voltage attributable to a variation in the depth of the PN columns hardly occurs.

Other Embodiments

Figure 8:
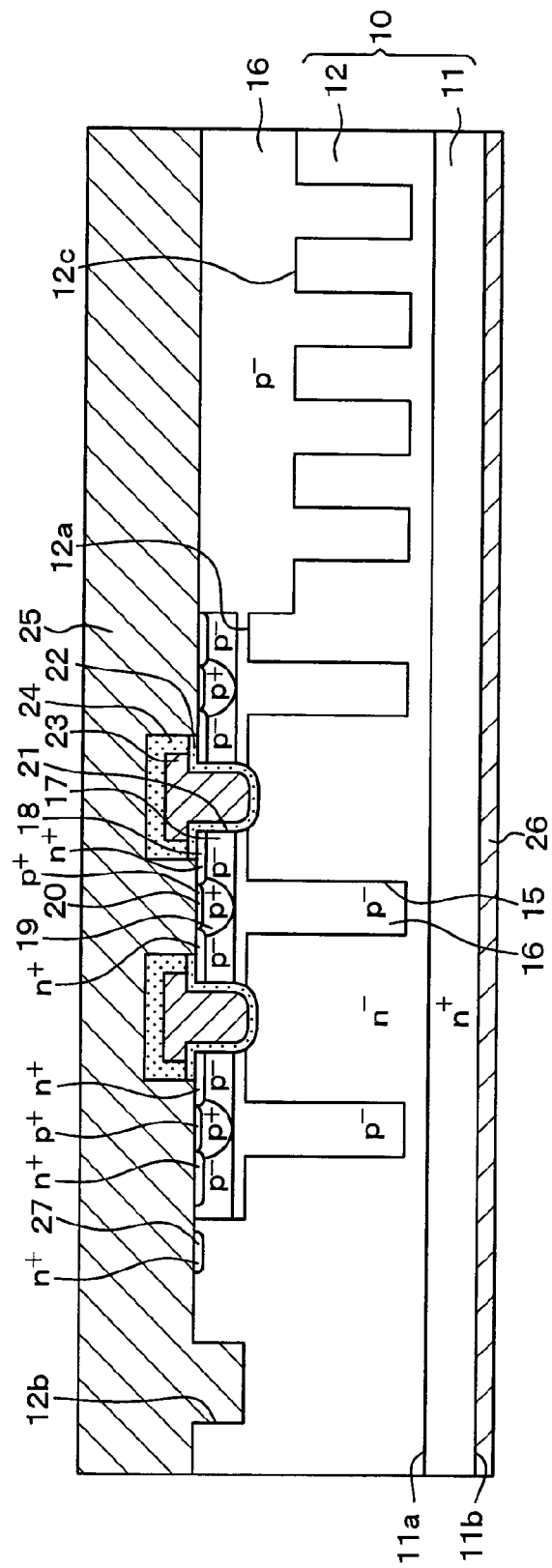
FIG. 8 is a cross-sectional view illustrating a process for producing a semiconductor device having a trench gate vertical MOSFFET of an SJ structure according to another embodiment.
Figure 10A:
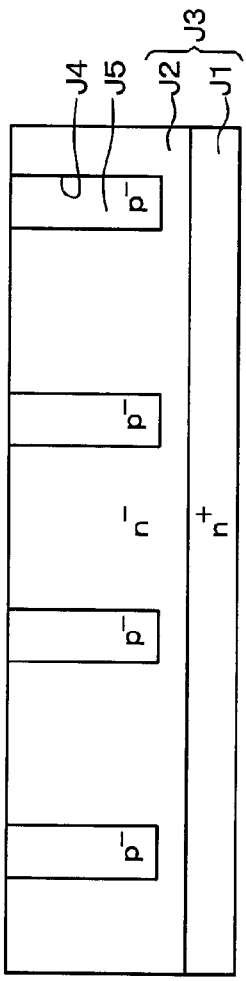
FIGS. 10A to 10C are cross-sectional views illustrating a process for producing the semiconductor device having the trench gate vertical MOSFFET of the trench gate structure of the SJ structure subsequent to FIG. 9C.
Figure 10B:
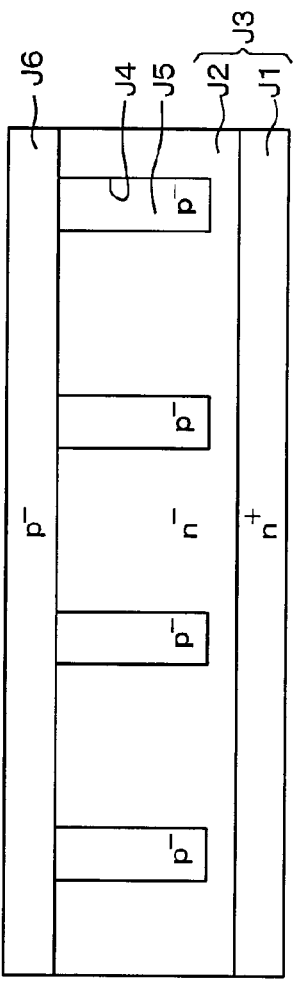
Figure 10C:
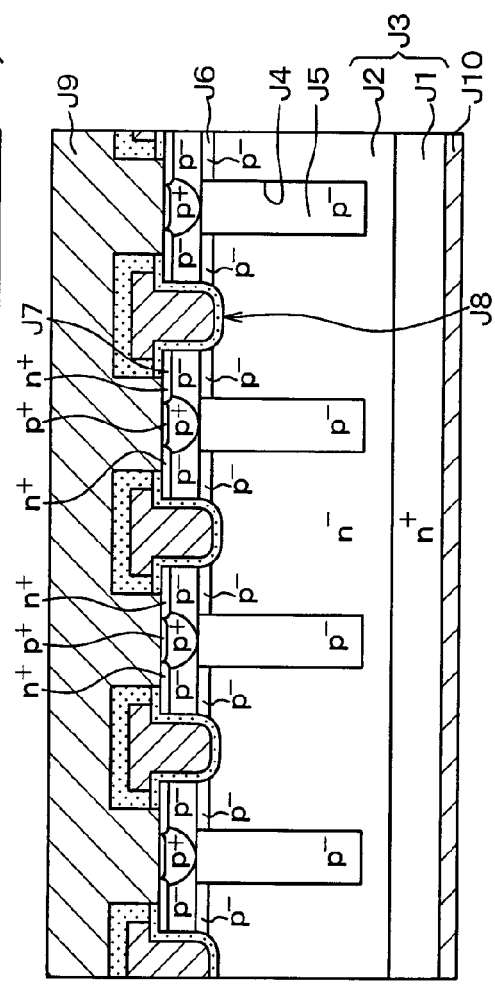

For example, the manufacturing method taking the periphery breakdown voltage structure into account as described in the third embodiment can be applied to the method for producing the semiconductor device having the trench gate vertical MOSFET described in the first embodiment. Specifically, after the processes including the process in FIG. 7A described in the third embodiment have been performed, the same process as that in FIG. 3B described in the first embodiment is performed to provide a trench gate vertical MOSFET illustrated in FIG. 8. As described above, similarly, in producing the semiconductor device having the trench gate vertical MOSFET, when the concave portion 12c is formed in the n⁻ type layer 12 in advance, the p⁻ type layer 16 remains in at least the concave portion 12c even after the flattening and polishing. With this process, the resurf layer 40 can be formed, and the same advantages as those in the third embodiment can be obtained.

Also, in the above respective embodiments, the MOSFET of the n-channel type in which the first conductivity type is n-type, and the second conductivity type is p-type has been described as an example. Alternatively, this disclosure can be applied to the MOSFET of the p-channel type in which the conductivity type of the respective components is reversed.

Also, in the above embodiment, the concave portion 12a is formed so that the step is formed between the main region and the scribe region. Alternatively, the concave portion 12a may be formed so that the step is formed in a place other than between those regions. For example, in wafer before being divided into the chip units, aside from the main region and the scribe region, unnecessary regions not chipped are present in the outer peripheral portions of those regions. For that reason, for example, the first concave portion 12a may be formed with the inclusion of the main region and the scribe region so that the step is formed between the main region and the scribe region, and the unnecessary regions. Also, the step may be formed in the outer peripheral portion of the main region. In that case, the first concave portion 12a may be formed with the inclusion of at least a part of the main region, specifically, with the inclusion of the cell region.

Further, in the above embodiment, the example of forming the first concave portion 12a so that the variation in the depth of the PN columns when forming the SJ structure can be suppressed is described. However, the abnormal growth of the p⁻ type layer 16 based on the process between the structures such as the flattening and polishing can be suppressed regardless of whether the first concave portion 12a is formed, or not. That is, the p⁻ type layer 16 is formed on portions of the n⁻ type layer 12 outside the trenches 15 continuously while the p⁻ type layer 16 is embedded in the trenches 15 formed in the n⁻ type layer 12. As a result, the abnormal growth of the p⁻ type layer 16 can be suppressed, and the deterioration of the device characteristics can be suppressed.

Fourth Embodiment

Subsequently, a method for producing a semiconductor device according to a fourth embodiment of the present disclosure will be described with reference to FIGS. 11A to 12B. A vertical MOSFET of an SJ structure will be exemplified by a semiconductor device having a trench gate vertical MOSFET.

Figures 11A, 11B, 11C:
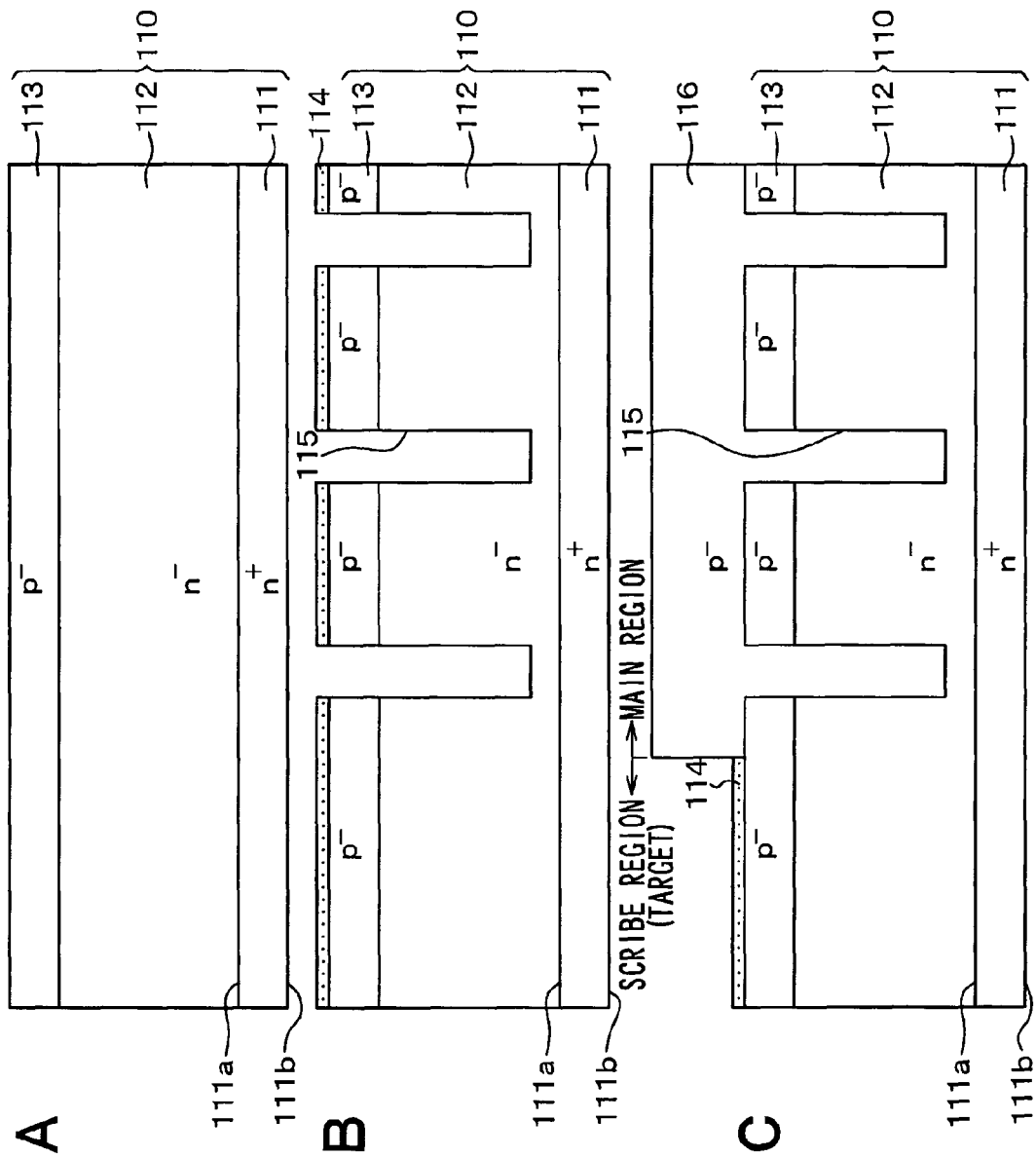
FIGS. 11A to 11C are cross-sectional views illustrating a process for producing a semiconductor device having a trench gate vertical MOSFFET of an SJ structure according to a fourth embodiment of the present disclosure.

[Process Illustrated in FIG. 11A]

A semiconductor substrate 110 is prepared. In the semiconductor substrate 110, an n⁻ type layer 112 corresponding to a first semiconductor layer and a p⁻ type layer 113 corresponding to a second semiconductor layer are epitaxially grown on a surface 111a of an n⁺ type silicon substrate 111 as a substrate made of a semiconductor material with the surface 111a and the rear surface 111b. The n⁺ type silicon substrate 111 is a portion that functions as a drain region, and set to be higher in an n-type impurity concentration than the n⁻ type layer 112. The n⁻ type layer 112 is a portion that functions as a drift layer and also configures an n-type column in PN columns. The p⁻ type layer 113 is intended to form the channel and configure a breakdown voltage structure in an outer periphery thereof not shown, and has a thickness of, for example, 3 to 7 μm.

[Process Illustrated in FIG. 11B]

On a surface side of the semiconductor substrate 110, an oxide film 114 is formed in thickness of 0.2 to 0.3 μm so as to cover the p⁻ type layer 113 through a CVD (chemical vapor deposition) technique or thermal oxidation. Thereafter, a resist not shown is arranged on the oxide film 114, and the resist is opened at positions where trenches are to be formed, and the oxide film 114 is opened at the open positions, through a photo etching process. Then, the resist is removed, and anisotropic etching such as an RIE (reactive ion etching) technique or a BOSCH technique is performed with the oxide film 114 as a mask. In the BOSCH technique, $O_2$ and $C_4F_8$ as well as $SF_6$ are alternately repetitively introduced to repetitively perform bottom etching and side wall protection using a polymer film. Specifically, the n⁻ type layer 112 is etched through the p⁻ type layer 113 by a predetermined depth, for example, a depth equal to or slightly smaller than a thickness of the n⁻ type layer 112. With this process, SJ structure formation trenches 115 which are, for example, stripped are formed at desired positions of the n⁻ type layer 112.

[Process Illustrated in FIG. 11C]

A portion of the oxide film 114 which is formed at a position distant from the trenches 115 is left, and portions of the oxide film 114 arranged in the periphery of the opening portions of the trenches 115 are removed.

For example, after a resist is again arranged on the oxide film 114, the resist is opened in the main region of the semiconductor substrate 110 where the vertical MOSFET is formed and used as a chip. Then, etching is performed in a state where the scribe region to be cut at the time of dicing which is a region for forming a target of alignment is covered with a resist to pattern the oxide film 114. Alternatively, hydrogen annealing is executed to retract the portions of the oxide film 114 which are formed around the opening portions of the trenches 115 of the oxide film 114. For example, in a reduced pressure atmosphere of 10.6 kPa (80 Torr) or lower, with the execution of hydrogen annealing at a temperature of 1100° C. for a time of 10 minutes, or hydrogen annealing at a temperature of 1170° C. for a time of 2 minutes, the periphery of the opening portions of the trenches 115 in the oxide film 114 can be removed.

Thereafter, on the surface side of the semiconductor substrate 110, a p$^-$ type layer 116 corresponding to a third semiconductor layer is epitaxially grown on a surface of the p$^-$ type layer 113 including the inside of the trenches 115 so that, for example, a p-type impurity concentration becomes $2\times10^{15}$ to $5\times10^{15}$ cm$^{-3}$. In this situation, over-epitaxial growth is performed, and in the over-epitaxial growth, the p$^-$ type layer 116 is also formed on the p$^-$ type layer 113 while being completely embedded in the respective trenches 115. For example, the p$^-$ type layer 116 is formed on the p$^-$ type layer 13 with a thickness of about 5 to 7 μm.

[Process Illustrated in FIG. 12A]

First, a portion of the p$^-$ type layer 116 which protrudes from the semiconductor substrate 110 more than the oxide film 114 is removed by flattening and polishing of the surface such as CMP (chemical mechanical polishing). In this situation, because the oxide film 114 different from the p$^-$ type layer 116 to be polished can be used as an end point detection stopper, the flattening and polishing can stop with high precision.

Subsequently, the oxide film 114 is etched. With this process, the oxide film 114 is removed in the scribe region and in the vicinity of the scribe region in the main region to form a step between the exposed p$^-$ type layer 113 and the p$^-$ type layer 116. For that reason, the surface is again flattened and polished through the CMP to flatten and polish the p$^-$ type layer 113 and the p$^-$ type layer 116 so as to eliminate the step. With this process, a structure in which the p$^-$ type layer 113 has already been formed on the p-type columns configuring the SJ structure and the SJ structure is completed.

Because a polishing process of the same semiconductor material (silicon) such as the p$^-$ type layer 113 and the p$^-$ type layer 116 is performed in planarizing the surface, there is nothing functioning as a stopper of the surface planarization. However, because the thickness of the oxide film 114 is as very thin as 0.2 to 0.3 μm, the flattening and polishing is performed without any large variation by only time control even if there is no stopper. Since the processing between the structures of the surface of the PN columns and the p$^-$ type layer 113 is not conducted, even if a slight variation occurs, a breakdown voltage of the semiconductor device is not largely varied.

[Process Illustrated in FIG. 12B]

The subsequent processes are identical with those in the conventional art. For example, the following manufacturing process is performed. That is, p-type impurities are ion-implanted into a surface layer part of the p$^-$ type layer 113 on the n$^-$ type layer 112 configuring the n-type columns to form a p$^-$ type channel layer 117. Also, n-type impurities are ion-implanted into a surface layer part of the p$^-$ type channel layer 117 to form an n$^+$ type source region 118. The p-type impurities are ion-implanted mainly into a portion of the p$^-$ type channel layer 117 which is formed on the p$^-$ type layer 116 to form a p$^+$ type body layer 119, and also form a p$^+$ type contact region 120 in a surface layer part of the p$^+$ type body layer 119. Each gate trench 121 that penetrates through the p$^-$ type channel layer 117 and reaches a portion of the n$^-$ type layer 112 which configures each n-type column is formed. Further, a gate insulating film 122 is formed to cover an inner wall surface of each gate trench 121, and a gate electrode 123 is formed on the gate insulating film 122 so as to be embedded in each gate trench 121. A process of forming interlayer insulating films 124, and a process of forming gate lines and a source electrode 125 are performed on the surface side of the semiconductor substrate 110. On the rear surface side of the semiconductor substrate 110, a process of forming a drain electrode 126 connected to the rear surface 111b of the n$^+$ type silicon substrate 111 is performed to form a trench gate vertical MOSFET of an n-channel. Thereafter, the vertical MOSFET is diced into chip units to complete semiconductor devices having the vertical MOSFET of the SJ structure.

According to the method for producing the semiconductor device according to this embodiment as described above, the p$^-$ type layer 113 is formed on the n$^-$ type layer 112 in advance before forming the trenches 115 for forming the p-type columns, and the trenches 115 are formed in the surface of the p$^-$ type layer 113. Then, the p$^-$ type layer 116 for forming the p-type columns is formed in the trenches 115 and on the p$^-$ type layer 113.

For that reason, unlike a case of forming the p$^-$ type layer 113 after the SJ structure has been configured, the flattening and polishing of the surface of the PN columns is not performed, and there is no need to perform processing between the structures of the surface of the PN columns and the p$^-$ type layer 113 such as the flattening and polishing or the wafer cleaning. Therefore, the depth of the PN columns is not affected by flattening and polishing the p$^-$ type layer 116. Hence, a variation in the breakdown voltage of the semiconductor device can be suppressed, and the deterioration of the device characteristic can be suppressed.

Fifth Embodiment

A fifth embodiment of the present disclosure will be described. In this embodiment, the vertical MOSFET formed in the semiconductor device in the fourth embodiment is changed to a planar type, and because the other configurations are identical with those in the fourth embodiment, only portions different from those in the fourth embodiment will be described.

A method for producing the vertical MOSFET according to this embodiment will be described with reference to FIGS. 13A and 13B.

Figure 13A:
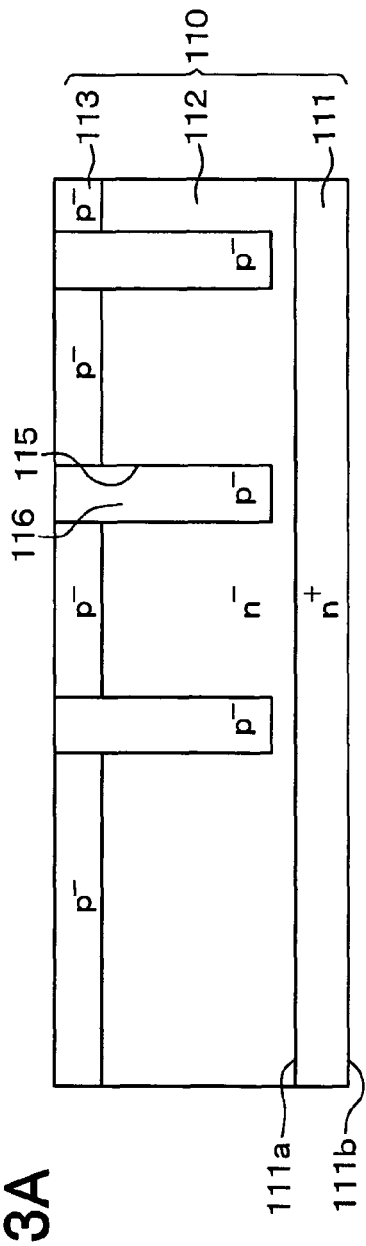
FIGS. 13A and 13B are cross-sectional views illustrating a process for producing a semiconductor device having a planar vertical MOSFFET of an SJ structure according to a fifth embodiment of the present disclosure.

First, after the same processes in FIGS. 11A to 11C described in the fourth embodiment is performed, the same process as that in FIG. 12A described in the fourth embodiment is performed in a process of FIG. 13A. With this process, a structure in which the p$^-$ type layer 113 has already been formed on the p-type columns configuring the SJ structure and the SJ structure is formed. Basically, those processes may be completely identical with those in the fourth embodiment. The thickness of the p$^-$ type layer 113 is set to the extent that an n-type connection layer 130 can be formed through the p$^-$ type layer 113 in forming the n-type connection layer 130 to be described later by ion implantation.

Figure 13B:
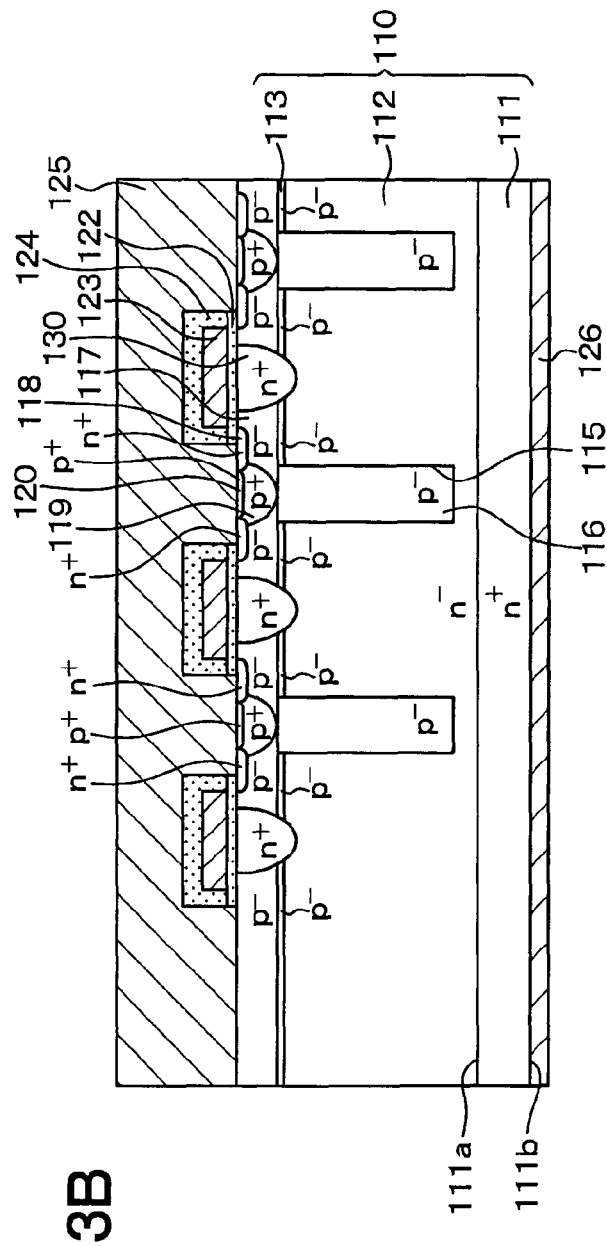
Figure 15A:
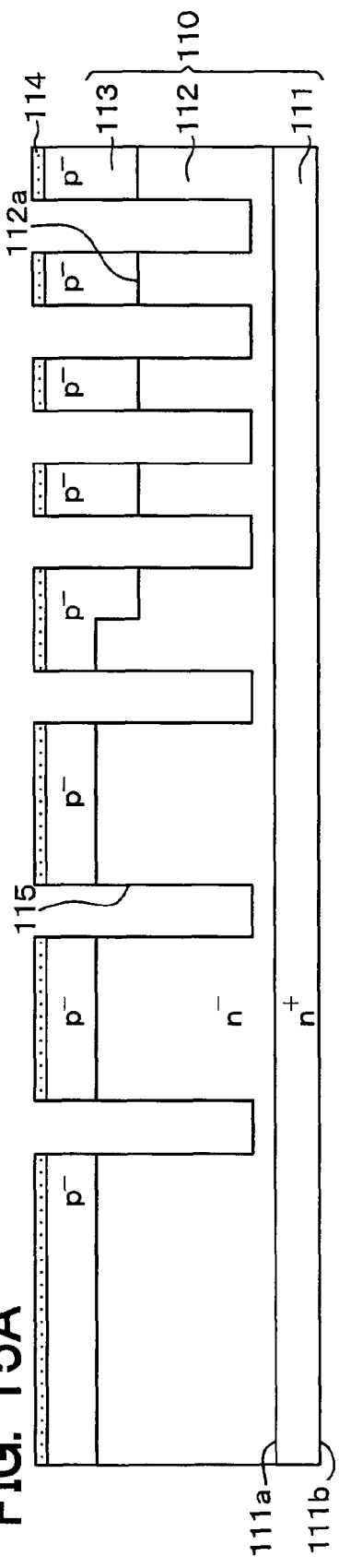
FIGS. 15A and 15B are cross-sectional views illustrating a process for producing the semiconductor device having the planar vertical MOSFFET of the SJ structure subsequent to FIG. 14B.
Figure 15B:
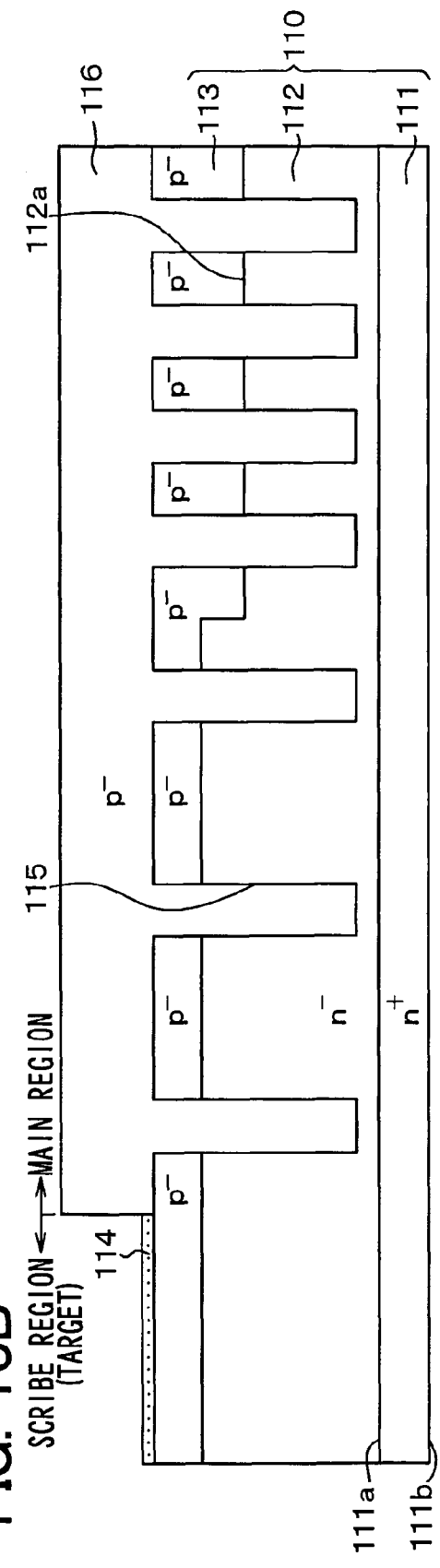

In a process illustrated in FIG. 13B, a manufacturing process for forming the respective components of the planar vertical MOSFET is performed.

That is, p-type impurities are ion-implanted into a surface layer part of the p$^-$ type layer 113 to form a p$^-$ type channel layer 117, and n-type impurities are ion-implanted into a surface layer part of the p$^-$ type channel layer 117 to form an n$^+$ type source region 18. The p-type impurities are ion-implanted mainly into a portion of the p$^-$ type channel layer 117 which is formed on each of the p$^-$ type layer 116 to form a p$^+$ type body layer 119, and also form a p$^+$ type contact region 120 in a surface layer part of the p$^+$ type body layer 119. Further, the n-type impurities are ion-implanted at a position spaced from each n$^+$ type source region 118 by a predetermine interval between the adjacent n$^+$ type source regions 118 which are arranged between the respective p$^+$ type contact region 120, to thereby form the n-type connection layer 130 that reaches the n$^-$ type layer 112 from the p$^-$ type channel layer 117. The n-type connection layer 130 is formed to penetrate through the p$^-$ type layer 113 and reach a portion of the n$^-$ type layer 112 which configures each of the n-type columns while coming in contact with a channel formation part in the p$^-$ type channel layer 117. With this configuration, the n-type connection layer 130 forms a current path when the planar vertical MOSFET operates, and serves to reduce an on-resistance.

Further, a gate insulating film 122 that covers at least a surface of the p$^-$ type channel layer 117 is formed, and a gate electrode 123 is formed on the gate insulating film 122. A process of forming interlayer insulating films 124, and a process of forming gate lines and a source electrode 125 are performed on the surface side of the semiconductor substrate 110. On the rear surface side of the semiconductor substrate 110, a process of forming a drain electrode 126 connected to the rear surface 111$b$ of the n$^+$ type silicon substrate 111 is performed to form a planar vertical MOSFET of an n-channel. Thereafter, the vertical MOSFET is diced into chip units to complete semiconductor devices having the planar vertical MOSFET of the SJ structure.

As described above, the same manufacturing method as that in the fourth embodiment can be also applied to the semiconductor device having the planar vertical MOSFET, and the same advantages as those in the fourth embodiment can be obtained.

Sixth Embodiment

A sixth embodiment of the present disclosure will be described. This embodiment is directed to a manufacturing method taking a periphery breakdown voltage structure of the semiconductor device into account, in the fifth embodiment, and because the other configurations are identical with those in the fifth embodiment, only portions different from those in the fifth embodiment will be described.

A method of manufacturing a vertical MOSFET according to this embodiment, that is, a manufacturing method including a process of forming the periphery breakdown voltage structure in the semiconductor device having the planar vertical MOSFET with the SJ structure will be described with reference to FIGS. 14A to 16B.

First, in a process illustrated in FIG. 14A, a substrate made of a semiconductor material with a surface 111$a$ and a rear surface 111$b$ is prepared. As the substrate, the n$^-$ type layer 112 corresponding to the first semiconductor layer is epitaxially grown on the surface 111$a$ of the n$^+$ type silicon substrate 111. Then, a concave portion 112$a$ is formed in a portion corresponding to an outer peripheral region of the n$^-$ type layer 112 through a photo-etching process using a mask not shown. Specifically, a region in which the vertical MOSFET is formed is set as a cell region, and a resurf layer is formed in the outer peripheral region to form the periphery breakdown voltage structure. The concave portion 112$a$ is formed in the portion forming the resurf layer.

Thereafter, in a process illustrated in FIG. 14B, a p$^-$ type layer 113 is epitaxially grown on the surface of the n$^-$ type layer 112 so as to be embedded in the concave portion 112$a$, and the surface is flattened and polished as occasion demands. In this situation, the p$^-$ type layer 113 is left in thickness of 3 to 7 μm, for example, on the surface of the n$^-$ type layer 112. With this process, the semiconductor substrate 110 in which the p$^-$ type layer 113 in the concave portion 112$a$ is thicker than a portion in which the concave portion 112$a$ is not formed is formed.

Thereafter, in processes illustrated in FIGS. 15A, 15B, 16A, and 16B, the same processes as those in FIGS. 11B and 11C described in the fourth embodiment and FIGS. 13A and 13B described in the fifth embodiment are performed. With those processes, the semiconductor device having the planar vertical MOSFET of the SJ structure is completed. In the semiconductor device, the p-type layer 116 is deeply formed in the outer peripheral region of the cell region to configure a resurf layer 140 as the periphery breakdown voltage structure.

As described above, the manufacturing method taking a case in which the resurf layer is formed as the periphery breakdown voltage structure into account can be taken. Even with this method, the same advantages as those in the fifth embodiment can be obtained.

Figure 17A:
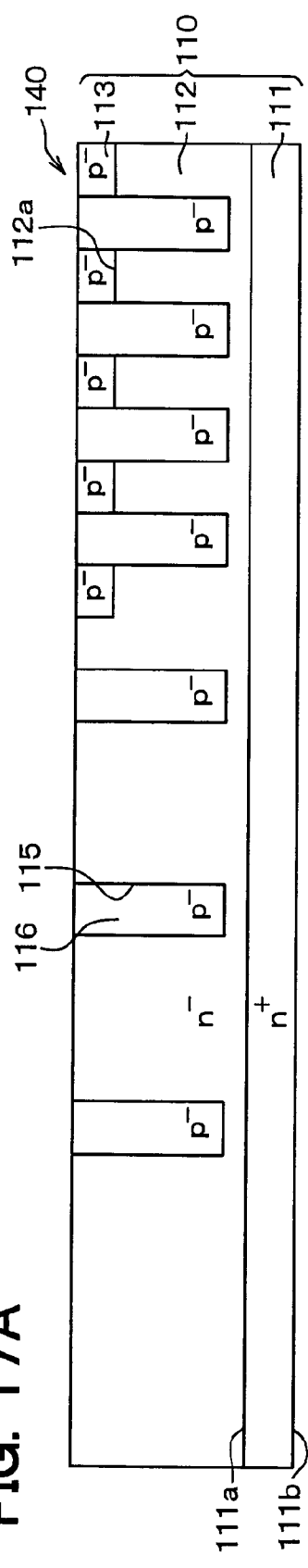
FIGS. 17A and 17B are cross-sectional views illustrating a state in which a p⁻ type layer 13 and a p⁻ type layer 16 are removed to the degree of exposing an n⁻ type layer 12 in flattening and polishing illustrated in FIG. 16A.
Figure 17B:
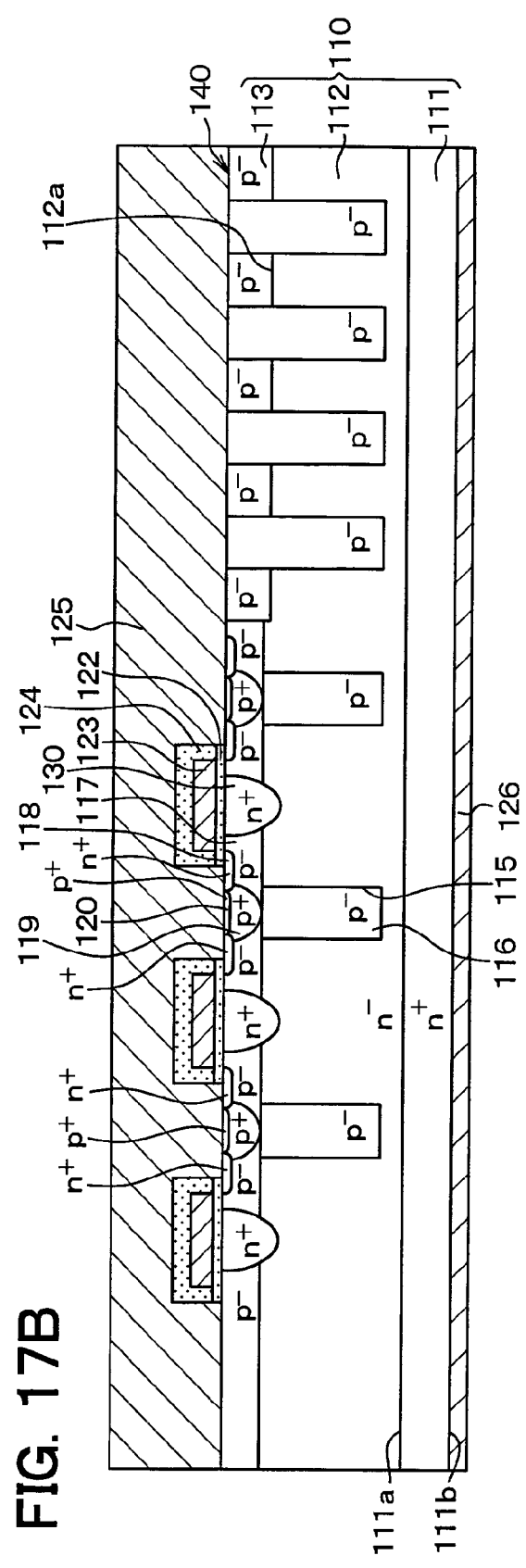

Even in the fifth embodiment, because the p$^-$ type layer 113 is also formed in the outer peripheral region, even if the concave portion 112$a$ is not formed, the resurf layer 140 can be formed in the outer peripheral region through the manufacturing method described in the fifth embodiment. However, for example, as illustrated in FIG. 17A, the p$^-$ type layer 113 and the p$^-$ type layer 116 may be removed to the degree that the n$^-$ type layer 112 is exposed when the surfaces of the p$^-$ type layer 113 and the p$^-$ type layer 116 illustrated in FIG. 16A are flattened and polished. Similarly, in that case, as illustrated in FIG. 17B, with the execution of the same process as that in FIG. 16B, the semiconductor device having the planar vertical MOSFET of the SJ structure can be manufactured. In that case, the p-type layer 116 is not left in the outer peripheral region, and the resurf layer 140 cannot be formed. Therefore, as in this embodiment, the concave portion 112$a$ is formed in the n$^-$ type layer 112 in advance, and the p$^-$ type layer 113 is formed to be thicker than the cell region in the outer peripheral region in advance. As a result, the resurf layer 140 can be surely formed.

When the flattening and polishing is performed to the extent that the surface of the n$^-$ type layer 112 is exposed, since the n$^-$ type layer 112 may be polished, there is a possibility that the depths of the PN columns are varied. However, because the on-resistance is reduced by the n-type connection layer 130, the flattening and polishing may be performed under a condition where the p$^-$ type layer 113 remains, and it is not essential to expose the n$^-$ type layer 112 as in the conventional art. For that reason, even if the n$^-$ type layer 112 is polished, the polishing amount is very small, a variation in the breakdown voltage attributable to a variation in the depth of the PN columns hardly occurs.

Other Embodiments

Figure 18:
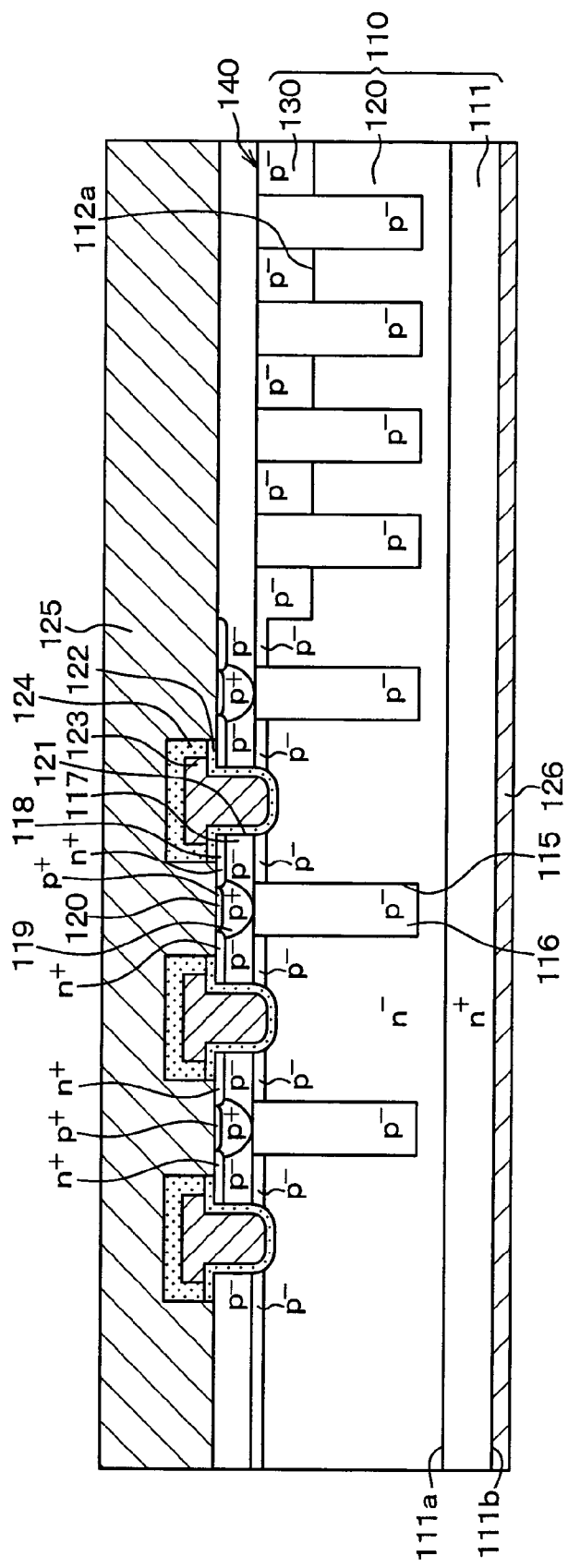
FIG. 18 is a cross-sectional view illustrating a process for producing a semiconductor device having a trench gate vertical MOSFFET of an SJ structure according to another embodiment.

For example, the manufacturing method taking the periphery breakdown voltage structure into account as described in the sixth embodiment can be applied to the method for producing the semiconductor device having the trench gate vertical MOSFET described in the fourth embodiment. Specifically, after the same processes as those in FIGS. 13A, 13B, 14A, 14B, and 15A described in the sixth embodiment have been performed, the same process as that in FIG. 12B described in the fourth embodiment is performed to provide a trench gate vertical MOSFET illustrated in FIG. 18. As described above, similarly, in producing the semiconductor device having the trench gate vertical MOSFET, when the concave portion 112a is formed in the n⁻ type layer 112 in advance, the p⁻ type layer 113 remains in at least the concave portion 112a even after the flattening and polishing. With this process, the resurf layer 140 can be formed, and the same advantages as those in the sixth embodiment can be obtained.

Also, in the above respective embodiments, the MOSFET of the n-channel type in which the first conductivity type is n-type, and the second conductivity type is p-type has been described as an example. Alternatively, this disclosure can be applied to the MOSFET of the p-channel type in which the conductivity type of the respective components is reversed.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A method for manufacturing a semiconductor device having a vertical MOSFET with a super junction structure, comprising:
   preparing a semiconductor substrate, in which a first semiconductor layer having a first conductivity type is formed on a surface of a substrate made of a semiconductor material;
   forming a step in the first semiconductor layer by forming a first concave portion that includes at least a part of a main region of the first semiconductor layer, the main region in which the vertical MOSFET is formed and used as a chip;
   forming a plurality of trenches by arranging a mask on the first semiconductor layer including an inside of the first concave portion, and etching the first semiconductor layer in the first concave portion of the main region using the mask;
   epitaxially growing a second semiconductor layer having a second conductivity type on the first semiconductor layer, and embedding the second semiconductor layer in each of the trenches and the first concave portion after removing at least a portion of the mask, which is formed in the first concave portion;
   forming a super junction structure having PN columns, in which a second conductivity type column provided by the second semiconductor layer left in each of the trenches and a first conductivity type column provided by the first semiconductor layer, which are arranged between the plurality of trenches, are alternately repeated, by flattening and polishing the second semiconductor layer to leave the second semiconductor layer in each of the trenches and the first concave portion; and
   forming the vertical MOSFET by: forming a channel layer having the first conductivity type and a source region having the second conductivity type in contact with the channel layer on the super junction structure; forming a gate electrode over a surface of the channel layer through a gate insulating film; forming a source electrode electrically connected to the source region on a surface side of the semiconductor substrate; and
   forming a drain electrode connected to a rear surface of the substrate on a rear surface side of the semiconductor substrate.

2. The method for manufacturing the semiconductor device having the vertical MOSFET with the super junction structure according to claim 1,
   wherein the forming of the step is performed by: forming the first concave portion extending to a vicinity of a boundary between the main region and a scribe region, which is cut at a dicing step; and forming the step between the main region and the scribe region.

3. The method for manufacturing the semiconductor device having the vertical MOSFET with the super junction structure according to claim 1,
   wherein the forming of the step is performed by leaving a part of the first semiconductor layer having a convex shape in at least a part of an outer edge of the main region at a boundary between the main region and a scribe region, which is cut at a dicing step.

4. The method for manufacturing the semiconductor device having the vertical MOSFET with the super junction structure according to claim 3, further comprising:
   forming a first conductivity type impurity layer, which is conducted with the first semiconductor layer, at a position where the part of the first semiconductor layer is left to have the convex shape.

5. The method for manufacturing the semiconductor device having the vertical MOSFET with the super junction structure according to claim 2, further comprising:
   forming a second concave portion, which is a target of alignment, in the scribe region.

6. The method for manufacturing the semiconductor device having the vertical MOSFET with the super junction structure according to claim 5,
   wherein the forming of the second concave portion is performed simultaneously with the forming of the first concave portion in the forming of the step.

7. The method for manufacturing the semiconductor device having the vertical MOSFET with the super junction structure according to claim 1, further comprising:
   forming a third concave portion in an outer peripheral region, which is a peripheral region of the main region where the vertical MOSFET is formed in the first semiconductor layer, before the epitaxially growing of the second semiconductor layer,
   wherein, in the epitaxially growing of the second semiconductor layer, the second semiconductor layer is formed on the first semiconductor layer to embed the second semiconductor layer in the third concave portion.

8. The method for manufacturing the semiconductor device having the vertical MOSFET with the super junction structure according to claim 1,
   wherein the forming of the vertical MOSFET includes:
      ion-implanting a second conductivity type impurity in the second semiconductor layer on the first conductivity type column to form the channel layer;
      ion-implanting a first conductivity type impurity into a surface layer part of the channel layer to form the source region;
      forming a gate trench that penetrates the channel layer, and reaches the first conductivity type column; and
      forming the gate insulating film on an inner wall surface of the gate trench, and
      forming the gate electrode on a surface of the gate insulating film, and wherein the vertical MOSFET is a trench gate vertical MOSFET.

9. The method for manufacturing the semiconductor device having the vertical MOSFET of the super junction structure according to claim 1,
wherein the forming of the vertical MOSFET includes:
ion-implanting a second conductivity type impurity in the second semiconductor layer on the first conductivity type column to form the channel layer;
ion-implanting a first conductivity type impurity into a surface layer part of the channel layer to form the source region;
ion-implanting the first conductivity type impurity at a position spaced apart from the source region by a predetermined distance to form a first conductivity type connection layer, which penetrates the channel layer, and reaches the first semiconductor layer; and
forming the gate insulating film on a surface of the channel layer, and
forming the gate electrode on a surface of the gate insulating film, and
wherein the vertical MOSFET is a planar vertical MOSFET.

10. A method for manufacturing a semiconductor device having a vertical MOSFET with a super junction structure, comprising:
preparing a semiconductor substrate, in which a first semiconductor layer of a first conductivity type is formed on a surface of a substrate made of a semiconductor material;
forming a plurality of trenches by etching the first semiconductor layer in a main region, in which the vertical MOSFT is formed and used as a chip, after a mask is arranged on the first semiconductor layer;
forming the super junction structure having PN columns, in which a second conductivity type column provided by a second semiconductor layer left in each of the trenches and a first conductivity type column provided by the first semiconductor layer arranged between the plurality of trenches are alternately repeated, by epitaxially growing the second semiconductor layer having a second conductivity type on a part of the first semiconductor layer outside of the trenches, and embedding the second semiconductor layer in each of the trenches; and
forming the vertical MOSFET by: forming a channel layer having the first conductivity type and a source region having the second conductivity type in contact with the channel layer on the super junction structure; forming a gate electrode over a surface of the channel layer through a gate insulating film; forming a source electrode electrically connected to the source region on a surface side of the semiconductor substrate; and forming a drain electrode connected to a rear surface of the semiconductor substrate on the rear surface side of the semiconductor substrate.

11. A semiconductor device having a vertical MOSFET with a super junction structure, comprising:
a semiconductor substrate, in which a first semiconductor layer having a first conductivity type is arranged on a surface of a substrate made of a semiconductor material;
a first concave portion that is arranged in a part of the first semiconductor layer;
a convex portion that is provided by a step arranged in the first semiconductor layer with the first concave portion, and is located in the first semiconductor layer outside the first concave portion;
a plurality of trenches that is arranged in the first semiconductor layer on a lower side of the first concave portion;
a second semiconductor layer having a second conductivity type that is embedded in each of the trenches and the first concave portion, and epitaxially arranged on the first semiconductor layer;
the super junction structure having PN columns, in which a second conductivity type column provided by the second semiconductor in each of the trenches, and a first conductivity type column provided by the first semiconductor layer arranged between the plurality of trenches are alternately repeated;
a channel layer having a first conductivity type and a source region having a second conductivity type in contact with the channel layer, which are arranged on the super junction structure;
a gate electrode that is arranged over a surface of the channel layer through a gate insulating film;
a source electrode that is electrically connected to the source region; and
a drain electrode that is connected to a rear surface of the substrate arranged on a rear surface side of the semiconductor substrate.

12. The semiconductor device having the vertical MOSFET with the super junction structure according to claim 11, further comprising:
a first conductivity type impurity layer that is conducted with the first semiconductor layer, which is arranged on the convex portion.

13. A method for manufacturing a semiconductor device having a vertical MOSFET with a super junction structure, comprising:
preparing a semiconductor substrate, in which a first semiconductor substrate having a first conductivity type is formed on a surface of a substrate made of a semiconductor material, and a second semiconductor layer having a second conductivity type is formed on the first semiconductor layer;
forming a plurality of trenches that penetrates the second semiconductor layer, and reaches the first semiconductor layer by arranging a mask on the second semiconductor layer, and etching the second semiconductor layer and the first semiconductor layer using the mask;
epitaxially growing a third semiconductor layer having a second conductivity type on the second semiconductor layer, and embedding the third semiconductor layer in each of the trenches after removing at least a portion of the mask which is located in a periphery of each of the trenches;
forming the super junction structure having PN columns, in which a second conductivity column provided by the third semiconductor layer left in each of the trenches and a first conductivity type column provided by the first semiconductor layer between the plurality of trenches are alternately repeated, by flattening and polishing the third semiconductor layer to expose the second semiconductor layer and to leave the third semiconductor layer in each of the trenches; and
forming the vertical MOSFET by: forming a channel layer having the first conductivity type and a source region having the second conductivity type in contact with the channel layer on the super junction structure;

forming a gate electrode over a surface of the channel layer through a gate insulating film; forming a source electrode electrically connected to the source region on a surface side of the semiconductor substrate; and forming a drain electrode connected to a rear surface of the substrate on a rear surface side of the semiconductor substrate.

14. The method for manufacturing the semiconductor device having the vertical MOSFET with the super junction structure according to claim 13, wherein the preparing of the semiconductor substrate is performed by: preparing the semiconductor substrate, in which a concave portion is formed in an outer peripheral region of the first semiconductor layer as a peripheral region of a cell region in which the vertical MOSFET is formed, and the second semiconductor layer is formed on the first semiconductor layer to embed the second semiconductor layer in the concave portion.

15. The method for manufacturing the semiconductor device having the vertical MOSFET with the super junction structure according to claim 13, wherein the forming of the vertical MOSFET includes:
ion-implanting a second conductivity type impurity in the second semiconductor layer on the first conductivity type column to form the channel layer;
ion-implanting a first conductivity type impurity into a surface layer part of the channel layer to form the source region;
forming a gate trench that penetrates the channel layer, and reaches the first conductivity type column; and
forming the gate insulating film on an inner wall surface of the gate trench; and
forming the gate electrode on a surface of the gate insulating film, and
wherein the vertical MOSFET is a trench gate vertical MOSFET.

16. The method for manufacturing the semiconductor device having the vertical MOSFET with the super junction structure according to claim 13, wherein the formation of the vertical MOSFET includes:
ion-implanting a second conductivity type impurity in the second semiconductor layer on the first conductivity type column to form the channel layer;
ion-implanting a first conductivity type impurity into a surface layer part of the channel layer to form the source region;
ion-implanting the first conductivity type impurity at a position spaced apart from the source region by a predetermined distance to form a first conductivity type connection layer that penetrates the channel layer, and reaches the first semiconductor layer; and
forming the gate insulating film on a surface of the channel layer; and
forming the gate electrode on a surface of the gate insulating film, and
wherein the vertical MOSFET is a planar vertical MOSFET.

\* \* \* \* \*